(12) United States Patent
Fujisawa et al.

(10) Patent No.: US 6,657,265 B2
(45) Date of Patent: Dec. 2, 2003

(54) SEMICONDUCTOR DEVICE AND ITS MANUFACTURING METHOD

(75) Inventors: Masahiko Fujisawa, Tokyo (JP); Kenichi Mori, Tokyo (JP); Toshiaki Tsutsumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,532

(22) Filed: Oct. 30, 2001

(65) Prior Publication Data

US 2002/0109196 A1 Aug. 15, 2002

(30) Foreign Application Priority Data

Dec. 25, 2000 (JP) ........................................ 2000-392639

(51) Int. Cl.[7] .............................................. H01L 29/72
(52) U.S. Cl. ........................ 257/380; 257/381; 257/384; 257/393
(58) Field of Search ................................. 257/380, 381, 257/384, 393

(56) References Cited

FOREIGN PATENT DOCUMENTS

| JP | 02035741 | * 2/1990 | .................. 257/384 |
|----|----------|----------|--------------------------|
| JP | 3-110837 | 5/1991 | |
| JP | 9-326369 | 12/1997 | |
| JP | 11-330271 | 11/1999 | |

* cited by examiner

*Primary Examiner*—Edward Wojciechowicz
(74) *Attorney, Agent, or Firm*—McDermott, Will & Emery

(57) ABSTRACT

A semiconductor device includes metal silicide films formed on the surface of a source-drain region and of a gate electrode. On the metal silicide films, impurity regions are formed of a conductivity type opposite to the conductivity type of the source-drain region. This structure enables the contact resistance at the interfaces between contact layers and the metal silicide films even when the semiconductor integrated circuit is scaled down, thereby providing a high-speed semiconductor device and its manufacturing method.

6 Claims, 15 Drawing Sheets

SEMICONDUCTOR DEVICE AND ITS MANUFACTURING METHOD

BACKGROUND OF THE INVENTION

1. Field of the Invention

The present invention relates to a MOS (Metal Oxide Silicon) semiconductor device and its manufacturing method, and particularly to a semiconductor device with a suppressed-resistance contact structure and its manufacturing method.

2. Description of Related Art

With recent advances in design and process technology, it has become possible to manufacture high density integrated circuits. In parallel to the high integration, on-chip integrated circuits become faster and faster. In such environments, the salicide (self-aligned silicide) process, which forms a metal silicide film on the surface of the polysilicon layer of gate electrodes and on the surface of source-drain regions by the self-aligned technique, has great effect on reducing parasitic resistance of transistors, and hence is growing as an important technique governing the performance of the device.

FIG. 14 is a cross-sectional view showing a structure of an element of a conventional semiconductor device. In this figure, the reference numeral 101 designates a semiconductor substrate, 102 designates an isolation film, 103 designates a gate insulator, 104 designates a gate electrode, 1041 designates a polysilicon layer, 105 designates a sidewall insulator, 106 designates a source-drain region, 1042 and 107 designate a metal silicide film, 108 designates an interlayer insulating film, 109 designates a contact hole, 1010 designates a contact layer, 1011 designates a barrier metal, and 1012 designates a metal interconnection. The gate electrode 104 consists of the polysilicon layer 1041 and the metal silicide film 1042. As shown in FIG. 14, the metal silicide films 1042 and 107 are formed on the surface of the polysilicon layer 1041 and the source-drain region 106 to reduce resistance.

FIGS. 15 and 16 are cross-sectional views illustrating some steps of the manufacturing process of a conventional semiconductor device. Referring to FIG. 15, first, the isolation film 102 composed of silicon oxide is formed in the surface of the semiconductor substrate 101 to isolate individual active regions. Subsequently, a silicon oxide film is formed on the surface of the semiconductor substrate 101 in the active regions by thermal oxidation, followed by forming a polysilicon film on the silicon oxide. After that, the gate insulator 103 and the polysilicon layer 1041 are formed by patterning using a photoresist mask. FIG. 15 is a cross-sectional view showing the element of the semiconductor device at the end of the process step.

In FIG. 16, the reference numeral 1071 designates a metal film.

Referring to FIG. 16, the sidewall insulators 105 are formed by forming a silicon oxide film on the entire surface, followed by etching back. Then, the n-type source-drain region 106 is formed by ion implanting impurities such as phosphorus or arsenic, and by activating ion implanted impurities by heat treatment (in the case of p-type, boron or boron fluoride is implanted).

Subsequently, the metal film 1071 is formed on the entire surface, followed by forming the metal silicide films 1042 and 107 by causing reaction between the metal and silicon on the surface of the polysilicon layer 1041 and of the source-drain region 106 by applying heat treatment. FIG. 16 is a cross-sectional view showing a structure of the element of the semiconductor device at the end of the process step.

Subsequently, after removing the unreacted metal film 1071, the interlayer insulating film 108 composed of PSG (phospho-silicate glass) or BPSG (boro-phospho silicate glass) is formed on the entire surface, followed by forming the contact holes 109 reaching the gate electrode 104 and the source-drain region 106.

After that, the element of the semiconductor device as shown in FIG. 14 is completed by successively forming and patterning a Ti layer constituting the contact layer 1010, a TiN layer constituting the barrier metal 1011 and a metal film constituting the metal interconnections 1012 on the exposed surface.

Higher-speed devices of today, however, require devices with lower resistance. For example, Japanese patent application laid-open No. 11-330271/1999 discloses a technique for reducing the contact resistance at the interface between the silicide film and the semiconductor substrate by forming a silicide film after making the surface of the source-drain region amorphous after forming the source-drain regions of nMOS transistors. Japanese patent application laid-open No. 11-330271/1999 reduces it by implanting impurities with the same conductivity type as that of the source-drain regions again after forming a silicide film on the surface of the source-drain regions. Japanese patent application laid-open No. 11-330271/1999 reduces it by controlling the condition of impurity implantation into the source-drain regions.

The scale down of the device, however, presents a problem of reducing the diameters of the contact holes, thereby reducing the contact areas between the con-tact layers and the metal silicide films, and increasing the resistance between them. Furthermore, the heat treatment after forming the metal interconnections will diffuse the impurities such as arsenic (As) or phosphorus (P) from the source-drain regions of the nMOS transistors, which presents a problem in that the diffused impurities segregates on the interfaces between the contact layers and the metal silicide films, and hence increases the interface resistance between the contact layers and the metal silicide films.

In particular, as for a system LSI that comprises transistors of both DRAM memory cells and logic circuits formed on the same substrate, since the heat treatment for forming the capacitors of the DRAM memory cells is applied after the metallization for interconnecting the transistors of the logic circuits, the impurities are likely to diffuse from the source-drain regions of the nMOS transistors, presenting a problem of increasing the interface resistance between the contact layers and the metal silicide films.

SUMMARY OF THE INVENTION

The present invention is implemented to solve the foregoing problems. It is therefore an object of the present invention to provide a semiconductor device and its manufacturing method capable of reducing the contact resistance at the interfaces between the contact layers and the metal silicide films in spite of the scale down of semiconductor integrated circuits, thereby achieving higher-speed devices.

According to a first aspect of the present invention, there is provided a semiconductor device comprising: a first active region of a first conductivity type disposed in a main surface of a semiconductor substrate, the first active region being surrounded by an isolation film; first source region and drain region of a second conductivity type formed in the main surface of the first active region, the first source region and drain region being separated by a predetermined distance; a first gate electrode formed on the main surface of the first active region via a gate insulator, the first gate electrode facing a region between the first source region and drain region; a metal silicide layer and an impurity region of the first conductivity type that are formed on the surface of the first source region and drain region, and thinner than the first source region and drain region; and interconnections connected to the first source region and drain region, respectively.

Here, the impurity region of the first conductivity type may have a thickness equal to or less than half a thickness of the metal silicide layer.

The impurity region of the first conductivity type may be formed only at neighborhood of interfaces between the interconnections and the first source region and drain region.

The interconnections may each consist of a stack of a contact layer, a barrier metal and a metal.

The semiconductor device may further comprise: a second active region of the first conductivity type disposed in an area different from an area of the first active region in the main surface of the semiconductor substrate; second source region and drain region of the second conductivity type formed in the main surface of the second active region, the second source region and drain region being separated by a predetermined distance; a second gate electrode formed on the main surface of the second active region via a gate insulator, the second gate electrode facing a region between the second source region and drain region; and a capacitor connected to one of the second source region and drain region.

According to a second aspect of the present invention, there is provided a manufacturing process of a semiconductor device comprising the steps of: forming an isolation film on a main surface of a semiconductor substrate; forming a first gate electrode on a main surface of a first active region of a first conductivity type of the semiconductor substrate via a gate insulator, the first active region being surrounded by the isolation film; forming first source region and drain region of a second conductivity type in the main surface of the first active region, the first source region and drain region being separated by a predetermined distance with interposing between them an area facing the first gate electrode; forming a metal silicide layer in the main surface of the first source region and drain region, the metal silicate layer being thinner than the first source region and drain region; forming an impurity region of the first conductivity type in the main surface of the first source region and drain region, the impurity region being thinner than the first source region and drain region; forming a first interlayer insulating film on an entire surface; forming first contact holes in the first interlayer insulating film such that the first contact holes reaching the first source region and drain region; and forming interconnections connected to the first source region and drain region through the first contact holes.

Here, the impurity region of the first conductivity type may have a thickness equal to or less than half a thickness of the metal silicide layer.

The step of forming the impurity region of the first conductivity type comprises the substeps of: forming on the entire surface an insulating film after the step of forming the metal silicide layer on the main surface of the first source region and drain region, and before the step of forming the first interlayer insulating film; and ion implanting impurities of the first conductivity type through a surface of the insulating film.

The step of forming the impurity region of the first conductivity type may comprise the substep of: ion implanting impurities of the first conductivity type into the entire surface after the step of forming the first contact holes, and before the step of forming the interconnections.

The step of forming the impurity region of the first conductivity type may comprise the substeps of: burying an organic resin into the first contact holes after the step of forming the first contact holes, and before the step of ion implanting the impurities; and removing the organic resin before the step of forming the interconnections.

The first interlayer insulating film may be extended to the second active region, wherein the manufacturing process may further comprise the steps of: forming via a gate insulator a second gate electrode on a second active region of the first conductivity type disposed in an area different from an area of the first active region in the main surface of the semiconductor substrate; forming second source region and drain region of the second conductivity type in the main surface of the second active region, the second source region and drain region being separated by a predetermined distance and interposing between them a region facing the gate electrode; forming a second interlayer insulating film on the entire surface after the step of forming the interconnections; forming a second contact hole in the first interlayer insulating and in the second interlayer insulating film, the second contact hole reaching one of the second source region and drain region; and forming a capacitor connected to one of the second source region and drain region through the second contact hole.

DETAILED DESCRIPTION OF THE PREFERRED EMBODIMENTS

The invention will now be described with reference to the accompanying drawings.

Embodiment 1

Figure 1:
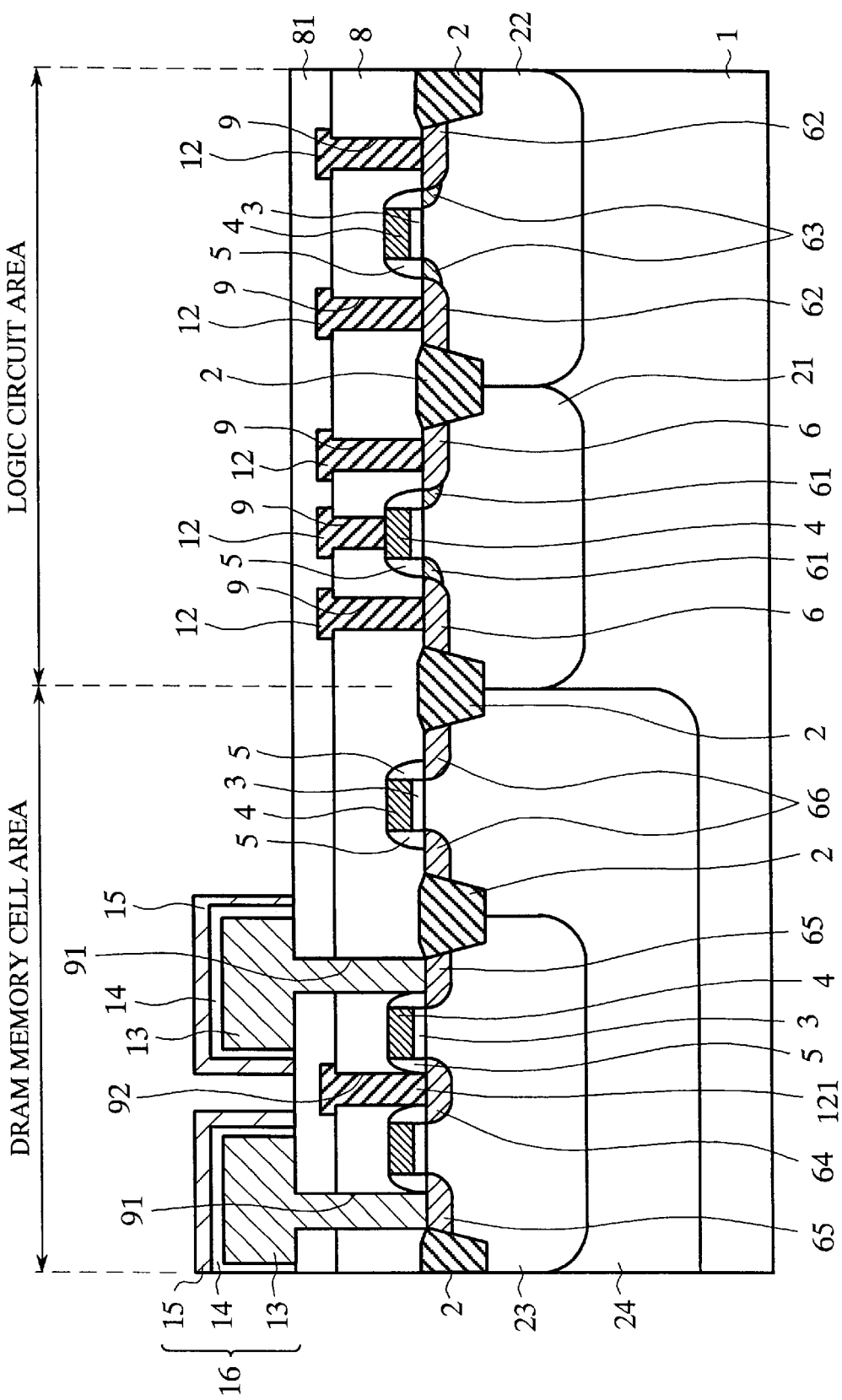
FIG. 1 is a cross-sectional view showing a structure of an embodiment 1 of the semiconductor device in accordance with the present invention.
Figure 2:
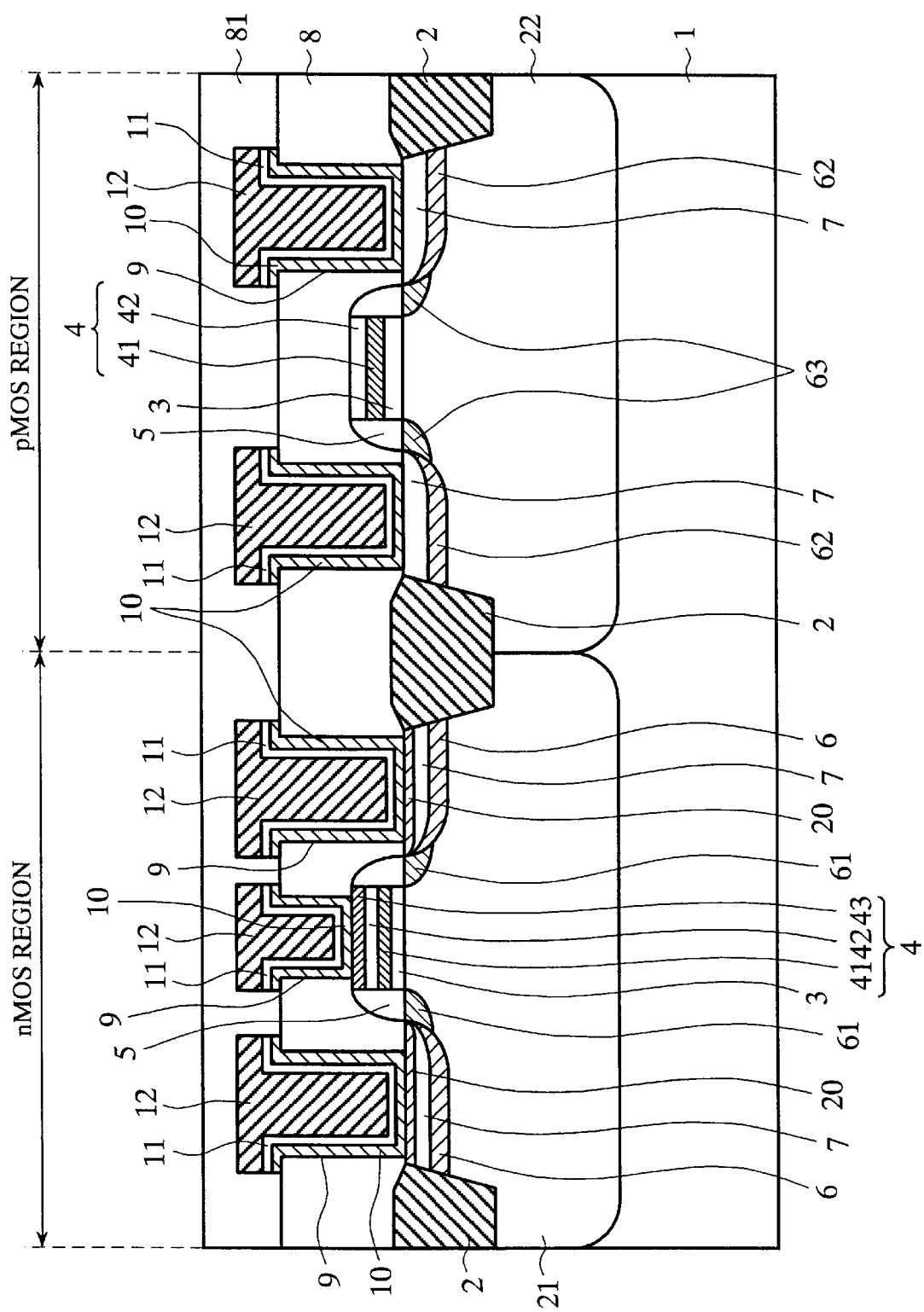
FIG. 2 is an enlarged cross-sectional view showing a structure of a logic circuit area of the embodiment 1 of the semiconductor device in accordance with the present invention.

FIGS. 1 and 2 are cross-sectional views showing a structure of an embodiment 1 of a semiconductor device in accordance with the present invention. FIG. 2 is an enlarged view of a logic circuit area of the semiconductor device as shown in FIG. 1. FIG. 1 shows a semiconductor device including logic circuits and memory cells embedded therein as an example. In FIG. 1, the reference numeral 1 designates a semiconductor substrate, 2 designates an isolation film, 21 and 23 each designate a p-well, 22 and 24 each designate an n-well, 3 designates a gate insulator, 4 designates a gate electrode, 5 designates a sidewall insulator, 6 and 61, and 64 and 65 designate an n-type source-drain region, 62 and 63, and 66 designate a p-type source-drain region, 8 and 81 designate an interlayer insulating film, 9, 91 and 92 each designate a contact hole, 12 and 121 each designate a metal interconnection, 13 designates a storage node, 14 designates a capacitor insulating film, and 15 designates a cell plate. The storage node 13, the capacitor insulating film 14 and the cell plate 15 constitute a capacitor 16.

In FIG. 1, the semiconductor substrate 1 has resistivity of 10 Ω-cm, with including p-type or n-type impurities of about $1 \times 10^{15}/cm^3$ in terms of concentration. In isolation regions, the isolation films 2 composed of silicon oxide, silicon nitride or silicon oxide nitride are formed. The p-wells 21 and 23, and n-wells 22 and 24 are formed by introducing the impurities into the surface of the semiconductor substrate 1 isolated by the isolation oxides 2.

Each transistor includes a punch through stopper layer and a channel injection layer (not shown) formed by ion implanting impurities as needed, in which the punch through stopper layer includes impurities of the same conductivity type as that of the well, and the channel injection layer includes impurities of the conductivity type opposite to that of the well (buried channel type), or impurities of the same conductivity type as that of the semiconductor well (surface channel type).

Next, transistors in the logic circuit area of the present embodiment 1 of the semiconductor device will be described with reference to FIG. 2. In FIG. 2, the reference numeral 41 designates a polysilicon layer, 42 and 7 each designate a metal silicide film, 10 designates a contact layer, 11 designates a barrier metal, and 20 designates a p-type impurity region. The gate electrode 4 is composed of the polysilicon layer 41 and the metal silicide film 42. The metal silicide films 42 and 7, which are formed on the surface of the polysilicon layer 41 and source-drain region 6 as shown in FIG. 2, serve to reduce the resistance.

When the transistors in the logic circuit area (first field effect device), have a gate length of about $L_1=200$ nm, the isolation films 2 are usually about 200 nm–500 nm wide and 150–500 nm deep. However, the isolation films 2 become even as wide as 5000 nm depending on the position. In such a case, the width of the isolation films 2 is controlled by preserving portions of the semiconductor substrate 1, where no element is formed (dummy pattern), to reduce the unevenness of the surface of the semiconductor substrate 1 and the isolation films 2.

The n-type source-drain region 6 contains n-type impurities like arsenic about $1 \times 10^{20}/cm^3$, and the n-type source-drain region 61 includes n-type impurities such as phosphorus about $1 \times 10^{18}/cm^3$, taking an LDD (Lightly Doped Drain) structure. The LDD structure is adopted as needed, and the source-drain region 61 can be omitted if not necessary.

On the surface of the source-drain region 6, the metal silicide film 7 composed of 30–60 nm deep cobalt silicide ($CoSi_2$) or the like is formed.

On the surface of the metal silicide film 7, the p-type impurity region 20 containing impurities such as boron or boron fluoride of about $1 \times 10^{19}$–$1 \times 10^{20}/cm^3$ is formed. The p-type impurity region 20 is formed such that the pn junction interface between it and the n-type impurities of the source-drain regions 6 and 61 becomes about 15–30 nm deep. The shallower, the better. It is preferable that it be formed equal to or less than half the thickness of the metal silicide film 7.

The gate insulators 3 are composed of a 3–7 nm thick thermal oxide film. Although the gate insulators 3 in the logic circuit area may be 5–10 nm as the gate insulator 3 in the DRAM memory cell area, they are preferably about 3–7 nm because the thinner gate insulators enable the ON current to flow sufficiently, thereby implementing faster transistors with higher driving power.

On the surface of the gate insulator 3 of the nMOS transistor, the gate electrode 4 is formed which is composed of the polysilicon layer 41, the metal silicide film 42 and the p-type impurity region 43. The polysilicon layer 41 is 150–250 nm thick with containing n-type impurities such as phosphorus or arsenic of about $2$–$15 \times 10^{20}/cm^3$. The metal silicide film 42 is 10–20 nm thick and composed of cobalt silicide and the like, and the p-type impurity region 43 contains impurities such as boron or boron fluoride of about $1 \times 10^{19}$–$1 \times 10^{20}/cm^3$.

Then, the metal interconnections 12 are formed which are connected to the source-drain regions 6 and 61, and to the gate electrode 4 via the contact holes 9 formed in the interlayer insulating film 8 composed of TEOS (tetraethyl orthosilicate) oxide or the like. The metal interconnections 12 are composed of a metal such as tungsten. Between the metal interconnection 12 and the metal silicide film 7, and between the metal interconnection 12 and the metal silicide film 42, the barrier metal 11 composed of the TiN or the like is formed to prevent the metal diffusion from the metal interconnections 12 to the source-drain region 6 and polysilicon layer 41.

The p-type source-drain region 62 contains p-type impurities such as boron or boron fluoride of about $1 \times 10^{20}/cm^3$, and the p-type source-drain region 63 contains p-type impurities such as boron or boron fluoride of about $1 \times 10^{18}/cm^3$ in the LDD (Lightly Doped Drain) structure. The LDD structure is adopted as needed, and the source-drain region 63 can be omitted if not necessarily.

On the surface of the source-drain region 62, the metal silicide film 7 of about 30–60 nm thick is formed using cobalt silicide or the like.

The gate insulator 3 composed of a thermal oxide film is about 3–7 nm thick. On the surface of the gate insulator 3 of the pMOS transistor, the gate electrode 4 consisting of the polysilicon layer 41 and the metal silicide film 42 is formed. The polysilicon layer 41 is about 150–250 nm thick with containing n-type impurities such as phosphorus or arsenic of about $2-15 \times 10^{20}/\text{cm}^3$, and the metal silicide film 42 is 10–20 nm thick and composed of cobalt silicide or the like.

Then, the metal interconnections 12 are formed which are connected to the source-drain regions 62 and 63, and to the gate electrode 4 via the contact holes 9 formed in the interlayer insulating film 8 composed of TEOS (tetraethyl orthosilicate) oxide or the like. The metal interconnections 12 are composed of a metal such as tungsten. Between the metal interconnections 12 and the metal silicide film 7, and between the metal interconnection 12 and the metal silicide film 42, the barrier metal 11 composed of the TiN or the like is formed to prevent the metal diffusion from the metal interconnections 12 to the source-drain region 6 and polysilicon layer 41.

Figure 3:
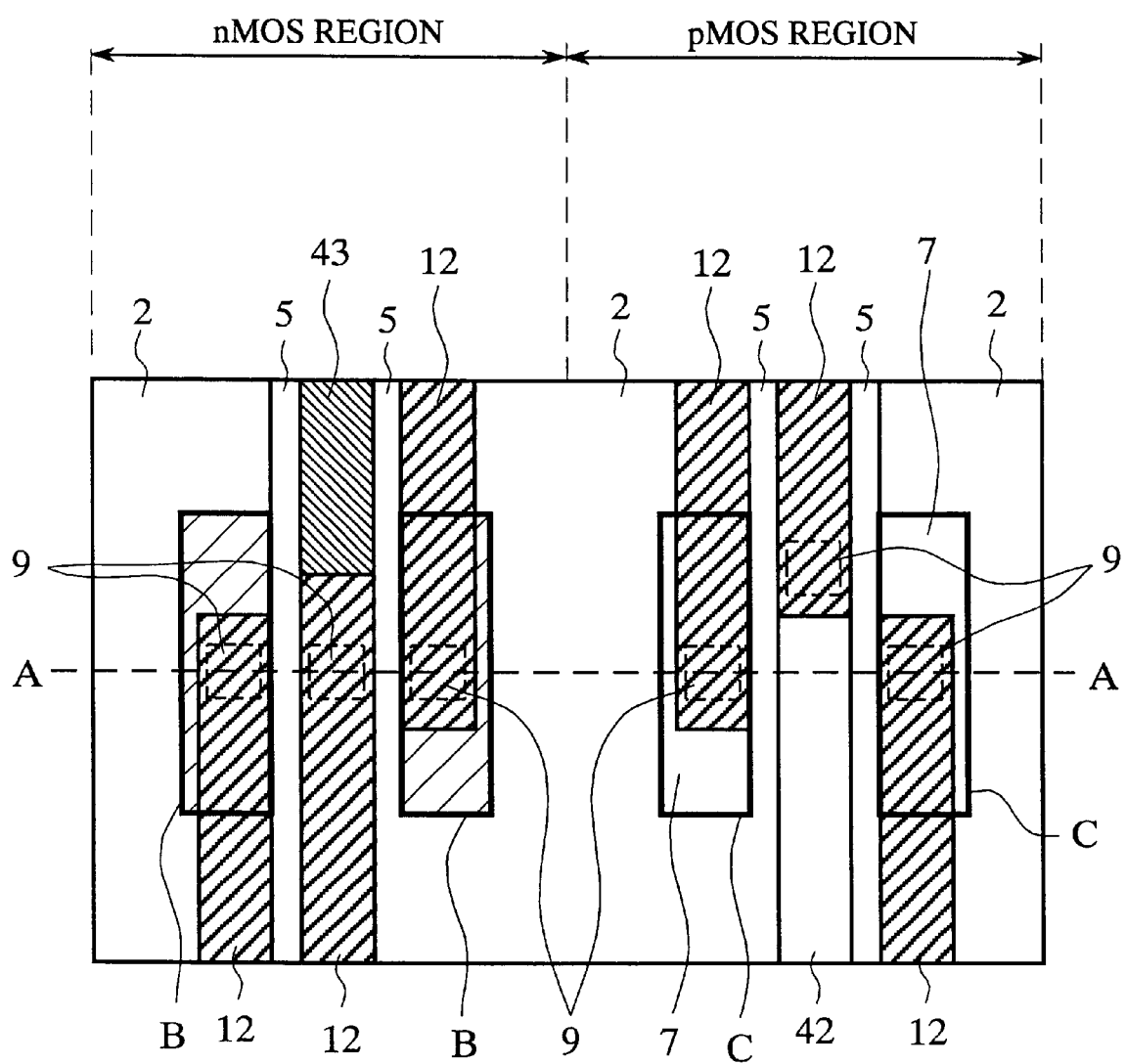
FIG. 3 is a plan view showing the structure of the embodiment 1 of the semiconductor device in accordance with the present invention.

FIG. 3 is a top view of the embodiment 1 of the semiconductor device in accordance with the present invention, which shows only the logic circuit area. The cross-sectional view of FIG. 2 is taken along A—A line of FIG. 3. In FIG. 3, the interlayer insulating films 8 and 81 are removed.

In the nMOS region of FIG. 3, the source-drain region 6, the p-type impurity region 20 and the metal silicide film 7 are formed in the entire surface of the semiconductor substrate 1 (portions enclosed by bold lines B) except for the portions covered with the isolation films 2, the gate electrode 4 and the sidewall insulator 5. On the other hand, in the pMOS region, the source-drain region 62 and the metal silicide film 7 are formed in the entire surface of the semiconductor substrate 1 (portions enclosed by bold lines C) except for the portions covered with the isolation film 2, the gate electrode 4 and the sidewall insulator 5.

In addition, in the nMOS region, the p-type impurity region 43 is formed on the top surface of the gate electrode 4, under which a stack consisting of the metal silicide film 42, the polysilicon layer 41 and the gate insulator 3 is formed. In the pMOS region, the gate electrode 4 is formed by stacking the gate insulator 3, the polysilicon layer 41 and the metal silicide film 42 in this order.

The metal interconnections 12, under which the barrier metal 11 and the contact layer 10 are stacked, are connected to the gate electrode 4 and the source-drain regions 6 and 62 through the contact holes 9 denoted by broken lines in FIG. 3.

When the transistors of the DRAM memory cell (second field effect device) in FIG. 1 have a gate length $L_2=200$ nm, the width of the isolation films 2 usually varies depending on its place from the minimum isolation width of 100 nm–200 nm to about 200 nm–400 nm at other portions, and the thickness of the isolation films 2 is about 150–500 nm.

On the surface of the semiconductor substrate 1, under which the p-well 23 is formed, the gate oxide film 3 of about 5–10 nm thick is formed. On the gate oxide film 3, the gate electrode 4 is formed which is about 150–250 nm in thickness, and composed of a polysilicon layer containing n-type impurities such as phosphorus or arsenic of about $2-15 \times 10^{20}/\text{cm}^3$. As the gate electrode in the logic circuit area, a 10–20 nm thick metal silicide film of cobalt silicide or the like may be formed on the surface of the gate electrode 4.

The source-drain regions 64 and 65 include impurities such as phosphorus or arsenic about $1 \times 10^{18}/\text{cm}^3$. The interconnection (bit line) 121 is formed which is connected to the source-drain region 64 through the contact hole 92 formed in the interlayer insulating film 8 composed of TEOS (tetraethyl orthosilicate) oxide or the like. At the interface between the interconnection 121 and the source-drain region 64, a contact layer and a barrier metal (not shown) are formed just as at the interface between the interconnection 12 and each source-drain region of the logic circuit area.

In addition, the capacitors 16 are formed which are connected to the source-drain region 65 through the contact hole 91 formed in the interlayer insulating films 81 composed of TEOS oxide or the like. Each capacitor 16 consists of the storage node 13, the capacitor insulating film 14 and the cell plate 15. The storage node 13 is composed of polysilicon containing phosphorus about $1-5 \times 10^{20}/\text{cm}^3$, the capacitor insulating film 14 is about 5–10 nm thick and composed of silicon nitride oxide, and the cell plate 15 is composed of polysilicon containing phosphorus about $1-5 \times 10^{20}/\text{cm}^3$. The storage node 13 is connected to the source-drain region 65 through the contact hole 91. Although a stack type capacitor is shown here, other type capacitors are applicable.

Each DRAM memory cell holds information by means of the charge stored in the capacitor, and carries out refresh (read/write) at fixed intervals. Accordingly, a junction leakage current that can flow through the capacitor will reduce the charge stored in the capacitor, thereby degrading the refresh characteristic (data holding characteristic). Therefore, it is more important for the DRAM memory cell to suppress the leakage current than for transistors of the other portions. To prevent the data loss from the capacitors because of the leakage current, the surfaces of the source-drain regions 64 and 65 are not usually covered with metal silicide films.

The gate oxide film 3 of about 5–10 nm thick is also formed on the surface of the semiconductor substrate 1 under which the n-well 24 is formed. On the gate oxide film 3, the gate electrode 4 including a polysilicon layer and a metal (silicide) layer is formed. The polysilicon layer is about 150–250 nm thick and contains p-type impurities such as boron about $2-15 \times 10^{20}/\text{cm}^3$, and the metal (silicide) layer is about 40–60 nm thick and composed of tungsten silicide or the like. When the polysilicon layer contains n-type impurities such as phosphorus or arsenic, the channel region is made a buried channel type by introducing impurities thereinto, thereby optimizing the threshold value. The gate electrode 4 can be composed of only the polysilicon layer without the metal (silicide) layer. The source-drain region 66 contains impurities such as boron of about $1 \times 10^{18}/\text{cm}^3$.

Although FIG. 1 shows only one p-well 23 formed in the n-well 24, memory cells including such capacitors are usually arranged in an array.

The n-well 24 surrounding the p-well 23 has a triple well structure that electrically isolates the p-well 23 from the other portions. Although the n-well 24 includes only one pMOS transistor, it can include a plurality of pMOS transistors, or no transistor. When the plurality of pMOS transistors are constructed, it is common that they are isolated each by isolation films. However, a plurality of transistors can be formed in a single active region.

Although the present embodiment shows an example of the interconnections, it is obvious that the number of layers of the interlayer insulating films formed between the transistors or their arrangement can vary depending on the circuit configuration, and that the impurity concentration or the peak depth positions of the impurity concentration can vary depending on the requirements for transistors or in proportion to the design rule of the well isolation.

As for the gate electrodes 4, although they are assumed to include the metal silicide film formed on the surface of the polysilicon layer, this is not essential. For example, they can take a polycide gate structure consisting of a stack of a 150–250 nm thick polysilicon layer and a 40–60 nm thick tungsten silicide (WSi) layer for the DRAM memory cell area only, or for both the DRAM memory cell area and the logic circuit area. In this case, the metal silicide film is formed only on the surface of the source-drain region of the logic circuit area by means of salicide.

Next, the operation of the present embodiment 1 will be described.

To write data to the capacitors 16, the voltages applied to the electrodes of the memory cells are placed at $V_G$=3.6 V, $v_B$=−1.0 V, the voltage applied to the metal interconnection 121 (bit line) connected to the source-drain region 64 is 0V, and the cell plate 15 is supplied with 1.0 V. In contrast, to erase the data, $V_G$=3.6 V, $V_B$=−1.0 V, the metal interconnection 121 connected to the source-drain region 64 is supplied with 2.0V, and the cell plate 15 with 1.0 V. To read the data, the voltage applied to the bit line is placed at about 1.0 V. These voltages are only an example, and can vary depending on the thickness of the gate oxide film or the gate length.

On the other hand, in the logic circuit area, applying voltages to the gate electrodes 4, source-drain regions 6, 61 and 63, and semiconductor substrate 1 (p-well 21 and n-well 22) brings about channels in the surface of the semiconductor substrate 1 under the gate electrodes 4 so that one side of the source-drain regions 6 and 61, and that of the source-drain regions 62 and 63, which are formed across the channels serve as a source, and the other side as the drain, enabling the circuit to operate. As for the nMOS transistors, for example, the voltages applied to the electrodes of the logic circuit are about $V_G$=2.5 V, $V_D$=2.5 V, $V_S$=0 V, and $V_B$=0 V. In contrast, as for the pMOS transistors, the voltages applied to the electrodes are about $V_G$=0 V, $V_D$=0 V, $V_S$=2.5 V, and $V_B$=2.5 V. These voltages are an example, and can vary depending on the gate oxide thickness or the gate length.

In this way, the transistor formed in the logic circuit area are connected to the transistors in the memory cell area or in adjacent areas, to control the circuit operation.

According to the present embodiment 1 of the semiconductor device, since the impurity regions with the conductivity type opposite to that of the n-type source-drain region are formed at the interfaces between the contact layers and the metal silicide films, the contact resistance at the interfaces between the contact layers and the metal silicide films can be reduce as in the pMOS region, thereby implementing a high-speed semiconductor device.

Furthermore, the depth from the surface of the semiconductor substrate to the pn-junction of the p-type impurity region and the n-type source-drain region is equal to or less than half the depth to the bottom of the metal silicide film formed on the surface of the source-drain region. Therefore, it is possible for the p-type impurity region to reform the metal silicide film, and to prevent the degradation in the characteristic of the transistors due to the diffusion of the p-type impurities to the n-type source-drain region.

Next, a manufacturing process of the present embodiment 1 of the semiconductor device in accordance with the present invention will be described.

Figure 4:
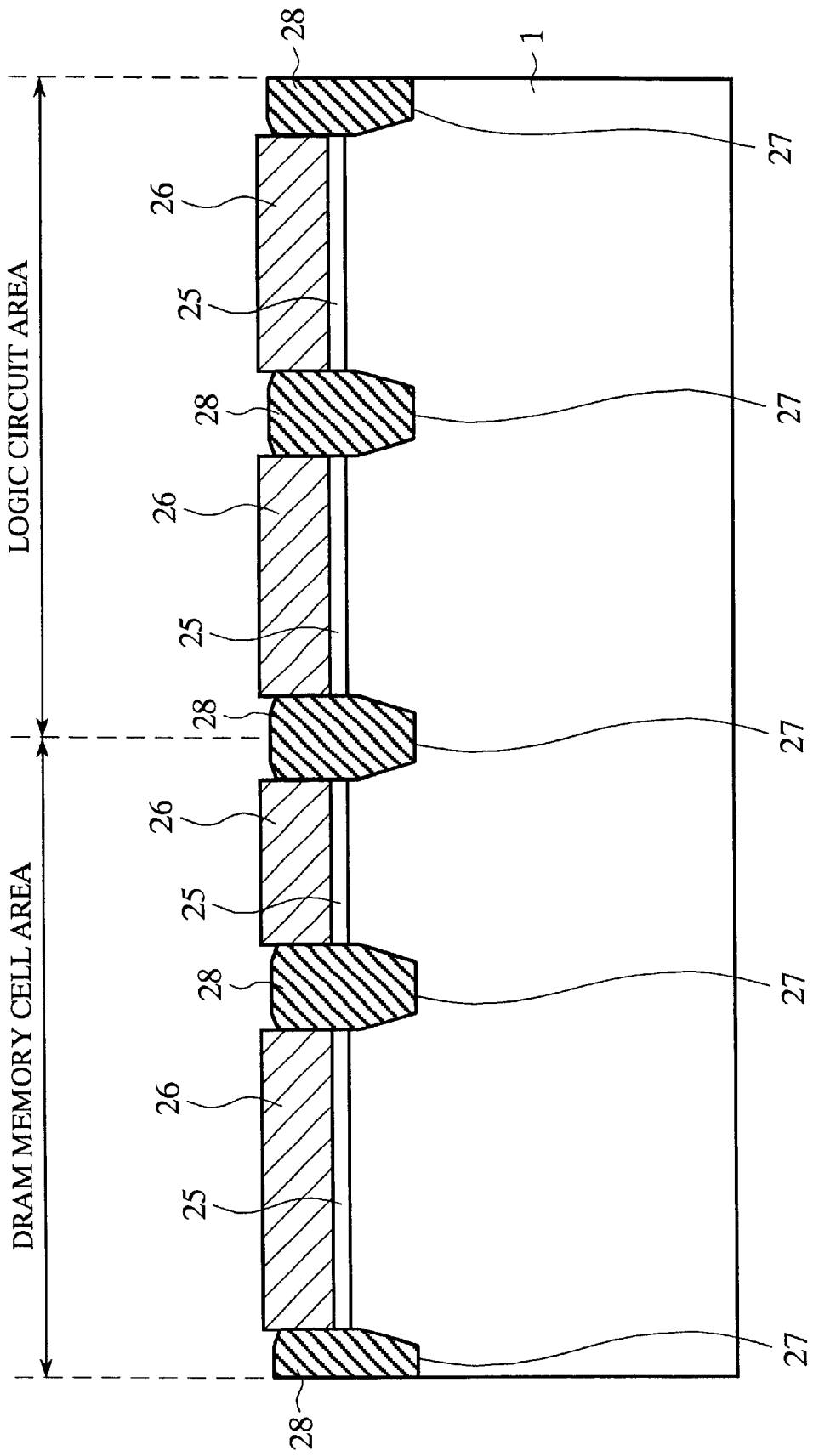
FIG. 4 is a cross-sectional view showing a step of a manufacturing process of the embodiment 1 of the semiconductor device in accordance with the present invention.

FIGS. 4–7 are cross-sectional views illustrating steps of the manufacturing process of the embodiment 1 of the semiconductor device. In FIG. 4, the reference numerals 25 and 28 each designate a silicon oxide film, the reference numeral 26 designates a silicon nitride film, and 27 designates a groove. In FIG. 4, a silicon oxide film 25 of about 5–30 nm thick and a silicon nitride film 26 of about 100–300 nm thick are formed on the surface of the semiconductor substrate 1. Then, using a photoresist mask (not shown), the silicon nitride film 26 and silicon oxide film 25 on the isolation region are selectively removed by anisotropic etching. After removing the photoresist mask by using the silicon nitride film 26 as a mask, the semiconductor substrate 1 is subjected to the anisotropic etching so that the grooves 27 with a width of about 200 nm–500 nm and a depth of about 150–500 nm are formed in the surface of the semiconductor substrate 1.

Subsequently, using LPCVD (low-pressure, chemical vapor deposition) method, the insulating film such as the silicon oxide film 28 is formed on the entire surface in the thickness of about 300 nm–800 nm. Then, by CMP (Chemical Mechanical Polishing) using the silicon nitride film 26 as a stopper, the silicon oxide film on the surface of the silicon nitride film 26 is removed so that the silicon oxide film 28 is left in the grooves 27 and in the openings of the silicon nitride film 26. FIG. 4 is a cross-sectional view showing the structure of the semiconductor device at the end of the process step.

Figure 5:
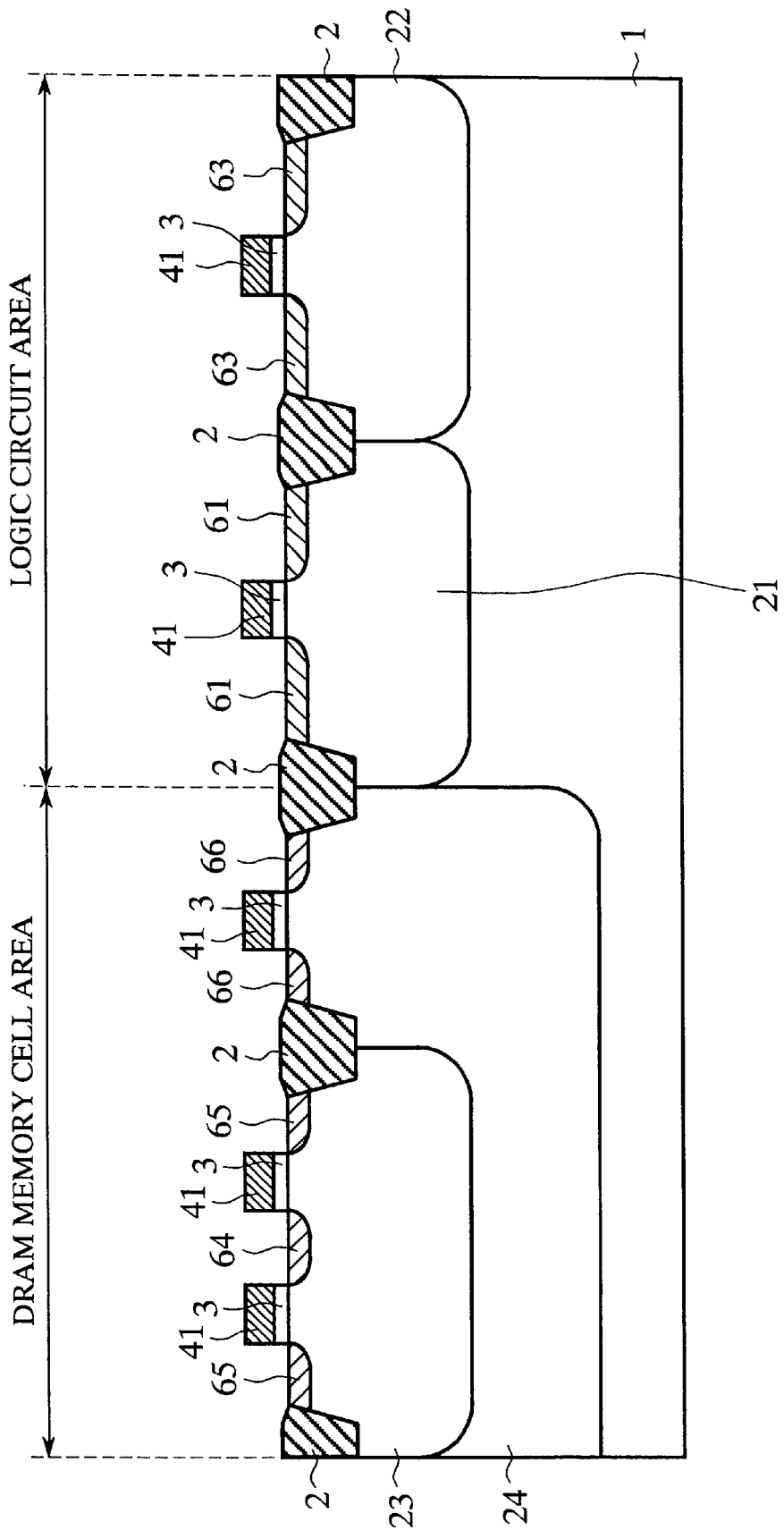
FIG. 5 is a cross-sectional view showing a step of the manufacturing process of the embodiment 1 of the semiconductor device in accordance with the present invention.

Next, referring to FIG. 5, the silicon nitride film 26, and then the silicon oxide film 25 are removed successively by wet etching using hot phosphoric acid so that the isolation films 2 are formed.

Subsequently, using the ion implantation and a photoresist mask as needed, the wells 21–24 are formed along with a punch through stopper layer and channel injection layer (not shown) These impurity layers can be formed simultaneously even for transistors in different areas such as the logic circuit area, memory cell area and peripheral area, as long as the conditions such as the impurity concentration distribution are the same. The sequence of forming the wells can be determined freely.

Next, a silicon oxide film of about 5–10 nm thick is formed on the entire surface of the semiconductor substrate 1 using thermal oxidation, to form the gate insulators 3. Subsequently, the polysilicon layer containing the n-type impurities such as phosphorus or arsenic of about 2–15× $10^{20}$/cm$^3$ is formed on the entire surface by the LPCVD (low-pressure CVD) method in the thickness of about 150–250 nm. After that, the polysilicon layer 41 constituting the gate electrode 4 is formed by patterning. To form the polycide gate structure consisting of a stack of a polysilicon layer and a tungsten silicide film, they are formed successively, followed by patterning.

To make the thickness of the gate insulators of the logic circuit area about 3–7 nm, and that of the DRAM memory cell area about 5–10 nm, the silicon oxide film to be shaped to the gate insulators 3 is formed on the entire surface of the semiconductor substrate 1 in the thickness of about 3–7 nm, followed by removing the silicon oxide film on the surface of the logic circuit area, and by forming the silicon oxide film of about 3–7 nm thick again on the entire surface.

The impurities in the gate electrode may be p-type impurities such as boron. To implement a dual gate structure, in which the gate electrode of the nMOS transistor contains n-type impurities, and the gate electrode of the pMOS transistor contains p-type impurities, the gate insulators 3 are formed, followed by forming polysilicon layers without impurities, and by ion implanting through a mask the n-type impurities into the nMOS region and the p-type impurities into the pMOS region.

After that, a photoresist mask with openings on the pMOS regions is formed, followed by ion implanting the p-type impurities such as boron at 40 KeV and 1×10¹⁴/cm² into the entire surface, thereby forming the source-drain regions 63 and 66.

Then, a photoresist mask with openings on the surface of the nMOS regions is formed, followed by ion implanting the n-type impurities such as phosphorus or arsenic at 40 KeV and 1×10¹⁴/cm² into the entire surface, thereby forming the source-drain regions 61, 64 and 65. FIG. 5 is a cross-sectional view showing the elements of the semiconductor device at the end of the process.

Figure 6:
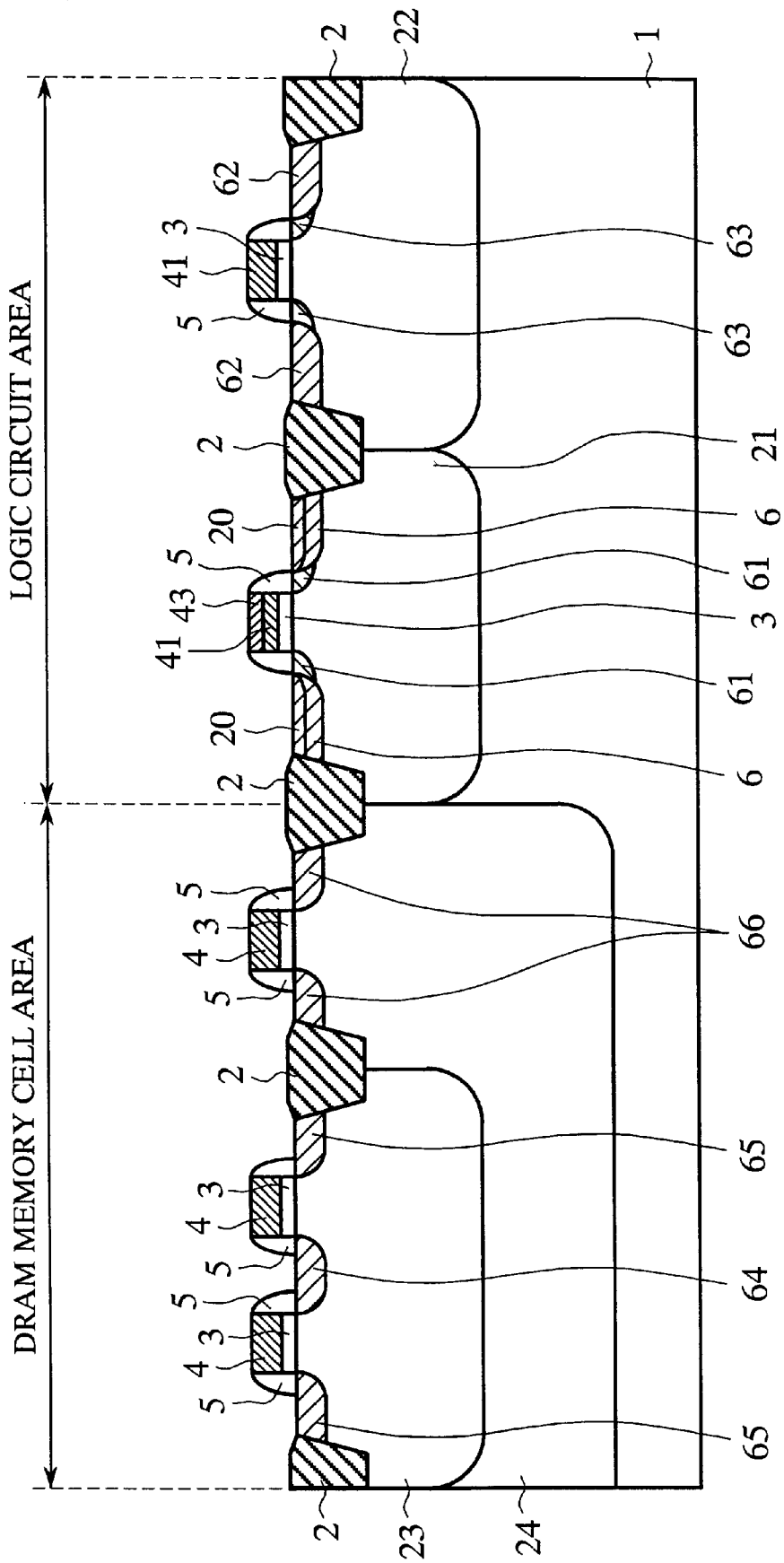
FIG. 6 is a cross-sectional view showing a step of the manufacturing process of the embodiment 1 of the semiconductor device in accordance with the present invention.

Next, referring to FIG. 6, an insulating film such as a silicon oxide film is formed on the entire surface in the thickness of about 30–100 nm by the CVD method, followed by etching back, thereby forming the sidewall insulators 5. Then, by ion implanting the p-type impurities such as boron into the pMOS regions, and the n-type impurities such as phosphorus or arsenic into the nMOS regions at about 100 KeV and 1×10¹⁵/cm², the source-drain regions 62 and 6 are formed, and the source-drain regions of the logic circuit area are made the LDD structure.

Subsequently, using the photoresist mask that was used for forming the source-drain regions 6 in the nMOS regions of the logic circuit area, the p-type impurity regions 20 and 43 are formed by ion implanting the p-type impurities such as boron at about 5 KeV and 1×10¹⁵/cm². FIG. 6 is a cross-sectional view showing the elements of the semiconductor device at the end of the process step.

When forming a new photoresist mask for the ion implantation for forming the p-type impurity regions 20 and 43, there is no problem even if the photoresist mask has openings on the surface of the pMOS regions in the logic circuit area, bringing about the ion implantation into the pMOS regions. When the gate electrode of the pMOS region contains n-type impurities (single gate structure), the surface may be covered with the photoresist mask.

The sidewall insulators 5 may be a stack film composed of the silicon oxide film and the silicon nitride film, in which case the silicon oxide film is formed by RTO (Rapid Thermal Oxidation), followed by depositing the silicon nitride film by the CVD method, and by the etching back.

In the present embodiment 1, the source-drain regions in the pMOS regions are formed separately from those in the nMOS regions. Even in the same conductivity type source-drain regions, when conditions such as the concentration or concentration distribution vary, they are formed separately to meet the conditions by the ion implantation using different masks. Besides, the implantation conditions vary depending on whether the source-drain regions have the LDD structure or not. Thus, as for the ion implantation in the nMOS regions and that of the pMOS regions, they are sometimes carried out in the opposite sequence.

Figure 7:
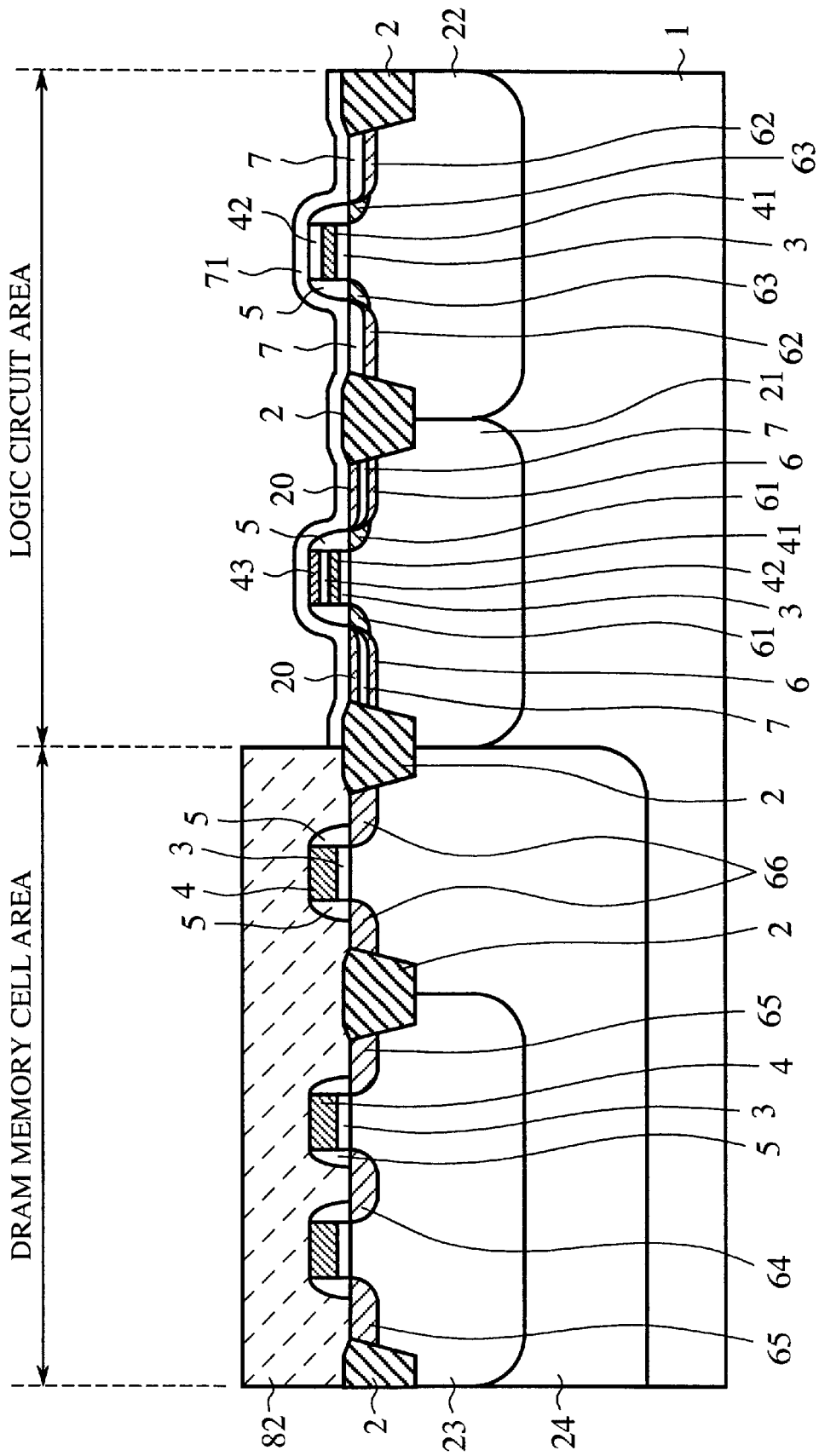
FIG. 7 is a cross-sectional view showing a step of the manufacturing process of the embodiment 1 of the semiconductor device in accordance with the present invention.

In FIG. 7, the reference numeral 71 designates a cobalt layer, and 82 designates a silicon oxide film. In FIG. 7, after forming an insulating film such as the silicon oxide film 82 covering the surface of the DRAM memory cell area, the cobalt layer 71 of about 10 nm thick is deposited on the entire surface, followed by the RTA (Rapid Thermal Annealing) at 750 ° C. for about 30 seconds. This process causes the silicon to react with the cobalt layer 71 at its exposed portions, thereby forming the metal silicide films 7 and 42. FIG. 7 is a cross-sectional view showing the elements of the semiconductor device at the end of the process step.

To form the metal silicide film 42 on the surface of the gate electrodes 4 of the DRAM memory cell area, a patterning that has openings on the surface of the gate electrodes 4 in the DRAM memory cell area is applied in the course of forming the silicon oxide film 82. To form the metal silicide film 7 only on the surface of the source-drain regions in the logic circuit area, a patterning that has openings on the surface of the source-drain regions in the logic circuit area is applied when forming the silicon oxide film 82.

After that, the wet etching is carried out using a liquid mixture of sulfuric acid and hydrogen peroxide, or a liquid mixture of ammonia and hydrogen peroxide, to remove cobalt left unreacted.

After depositing the interlayer insulating film 8 of about 200 nm–600 nm thick composed of PSG, BPSG or TEOS (tetraethyl orthosilicate) oxide by the LPCVD method, the contact holes 9, 0.1 μm–0.5 μm in diameter, are formed by the dry etching in such a manner that they reach the source-drain regions 6 and 61–64, and the gate electrodes 4 of the nMOS regions of the logic circuit area. Subsequently, the contact layers 10 composed of titanium of about 20 nm thick is formed on the entire surface, followed by forming barrier metals 11 composed of titanium nitride (TiN) of about 50 nm thick on the surface of the contact layers, by forming metal films composed of tungsten (W) of about 100 nm thick, and by forming the metal interconnections 12 by patterning.

After that, the interlayer insulating film 81 is formed in the same manner as the interlayer insulating film 8. Then, the contact holes 91 reaching the source-drain regions 65 of the memory cell area are formed, followed by forming the capacitors 16, each composed of the storage node 13, capacitor insulating film 14 and cell plate 15 connected through the contact hole 91. Likewise, metal interconnections (not shown) connected to the source-drain region 66 and gate electrode 4 are formed. In this way, the semiconductor device as shown in FIG. 1 is constructed.

Although the cobalt silicide is used for the metal silicide films in the present embodiment 1, titanium silicide (TiSi₂) or nickel silicide (NiSi or NiSi₂) can also be used.

The connections between the contact holes and the interconnections are variable depending on the circuit placement, and the sequence of forming them can be changed as needed. In addition, a multilayer connection is also applicable which comprises, on its upper layer, interconnections that are connected to the metal interconnections 12 via different interlayer insulating films. As interconnection materials, polysilicon containing impurities or metals can be used.

According to the manufacturing process of the present embodiment 1 of the semiconductor device, the p-type impurity regions, which have the conductivity type opposite to that of the n-type source-drain region, and are formed at the interfaces between the contact layers and the metal silicide films, can reduce the contact resistance at the interfaces between the contact layers and the metal silicide films, thereby providing a high-speed semiconductor device.

In particular, as for a system LSI in which transistors of the DRAM memory cells and logic circuits are formed on the same substrate, even when it undergoes the heat treatment for forming the capacitors of the DRAM memory cells after the metal interconnections for connecting the transistors of the logic circuits are formed, and hence the source-drain impurities of the nMOS transistors in the logic circuit area segregate to the interfaces between the contact layers and the metal silicide films, since the p-type impurity regions reform the metal silicide films, the manufacturing process of the semiconductor device can be implemented that can suppress the increase in the interface resistance between the contact layers and the metal silicide films.

Furthermore, the depth from the surface of the semiconductor substrate to the pn-junction of the p-type impurity region and the n-type source-drain region is equal to or less than half the depth to the bottom of the metal silicide film. Therefore, it is possible for the p-type impurity region to reform the metal silicide film, and to prevent the degradation in the characteristic of the transistors due to the diffusion of the p-type impurities to the n-type source-drain region.

Embodiment 2

Figure 8:
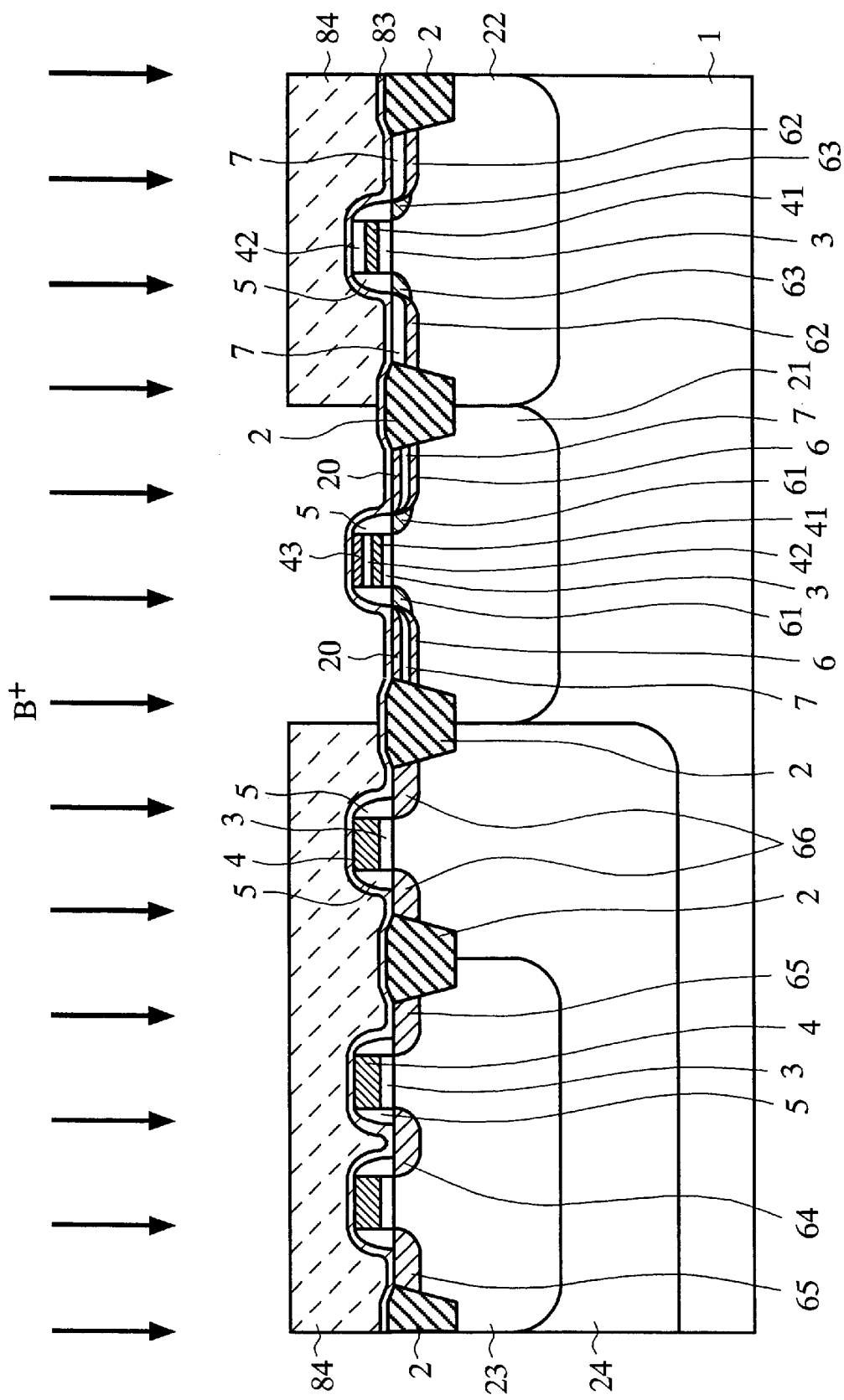
FIG. 8 is a cross-sectional view showing a step of a manufacturing process of an embodiment 2 of the semiconductor device in accordance with the present invention.
Figure 9:
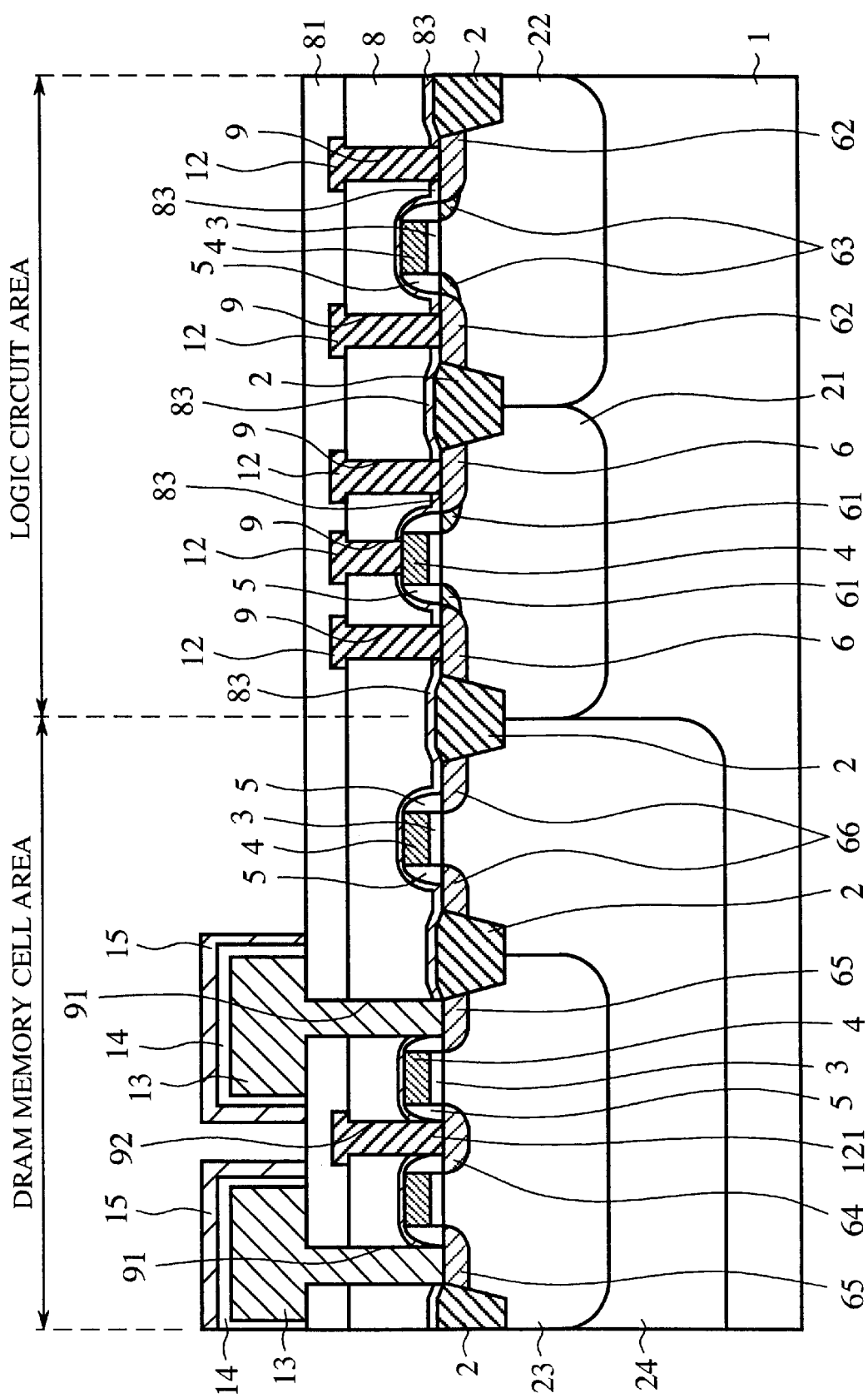
FIG. 9 is a cross-sectional view showing a step of the manufacturing process of the embodiment 2 of the semiconductor device in accordance with the present invention.

FIGS. 8 and 9 are cross-sectional views showing a manufacturing process of an embodiment 2 of the semiconductor device, which differs from that of the foregoing embodiment 1 of the semiconductor device. In FIGS. 8 and 9, the reference numeral 83 designates an interlayer insulating film, and 84 designates a photoresist mask.

First, as in the embodiment 1, the isolation films 2, wells 21–24, gate insulators 3, polysilicon layers 41, source-drain regions 6 and 61–66, and sidewall insulators 5 are formed on the surface of the semiconductor substrate 1.

Then, as in the embodiment 1, the metal silicide films 7 and 42 are formed, followed by forming the interlayer insulating film 83 composed of a silicon nitride film or the like of about 30 nm thick on the entire surface as shown in FIG. 8. Subsequently, the photoresist mask 84 having an opening on the surface of the nMOS region in the logic circuit area is formed, followed by ion implanting the p-type impurities such as boron into the entire surface at about 15 KeV and $1\times10^{15}/cm^2$, thereby forming the p-type impurity regions 20 and 43.

After that, as in the embodiment 1, the interlayer insulating film 8, contact layers 10, barrier metals 11, metal interconnections 12 and 121, interlayer insulating film 81 and capacitors 16 are formed, thereby constructing the semiconductor device as shown in FIG. 9 (see, FIG. 2 for the contact layers 10 and the barrier metals 11).

There is no problem even if the photoresist mask 84 has openings on the surface of the pMOS regions in the logic circuit area, thereby bringing about the ion implantation into the pMOS regions. When the gate electrode of the pMOS region contains n-type impurities (single gate structure), the surface may be covered with the photoresist mask.

In addition, the source-drain region 6 of the nMOS region can be formed using the photoresist mask 84.

According to the manufacturing process of the present embodiment 2 of the semiconductor device, the p-type impurity regions, which have the conductivity type opposite to that of the n-type source-drain region and are formed at the interfaces between the contact layers and the metal silicide films, can reduce the contact resistance at the interfaces between the contact layers and the metal silicide films, thereby implementing a high-speed semiconductor device.

In particular, as for a system LSI in which the transistors of the DRAM memory cells and logic circuits are formed on the same substrate, even when it undergoes the heat treatment for forming the capacitors of the DRAM memory cells after the metal interconnections for connecting the transistors of the logic circuits are formed, and hence the source-drain impurities of the nMOS transistors in the logic circuit area segregate to the interfaces between the contact layers and the metal silicide films, since the p-type impurity regions reform the metal silicide films, the manufacturing process of the semiconductor device can be implemented that can suppress the increase in the interface resistance between the contact layers and the metal silicide films.

Besides, although using a low acceleration energy ion implantation to form the impurity region with a shallow junction depth usually prolongs the time taken for achieving a desired dose because of the reduced ion current, and offers a problem of reducing the performance of the semiconductor manufacturing apparatus, the performance can be improved by maintaining sufficient acceleration energy by conducting the ion implantation through the thin insulating film composed of a silicon nitride film or the like to form the p-type impurity regions.

Embodiment 3

Figure 10:
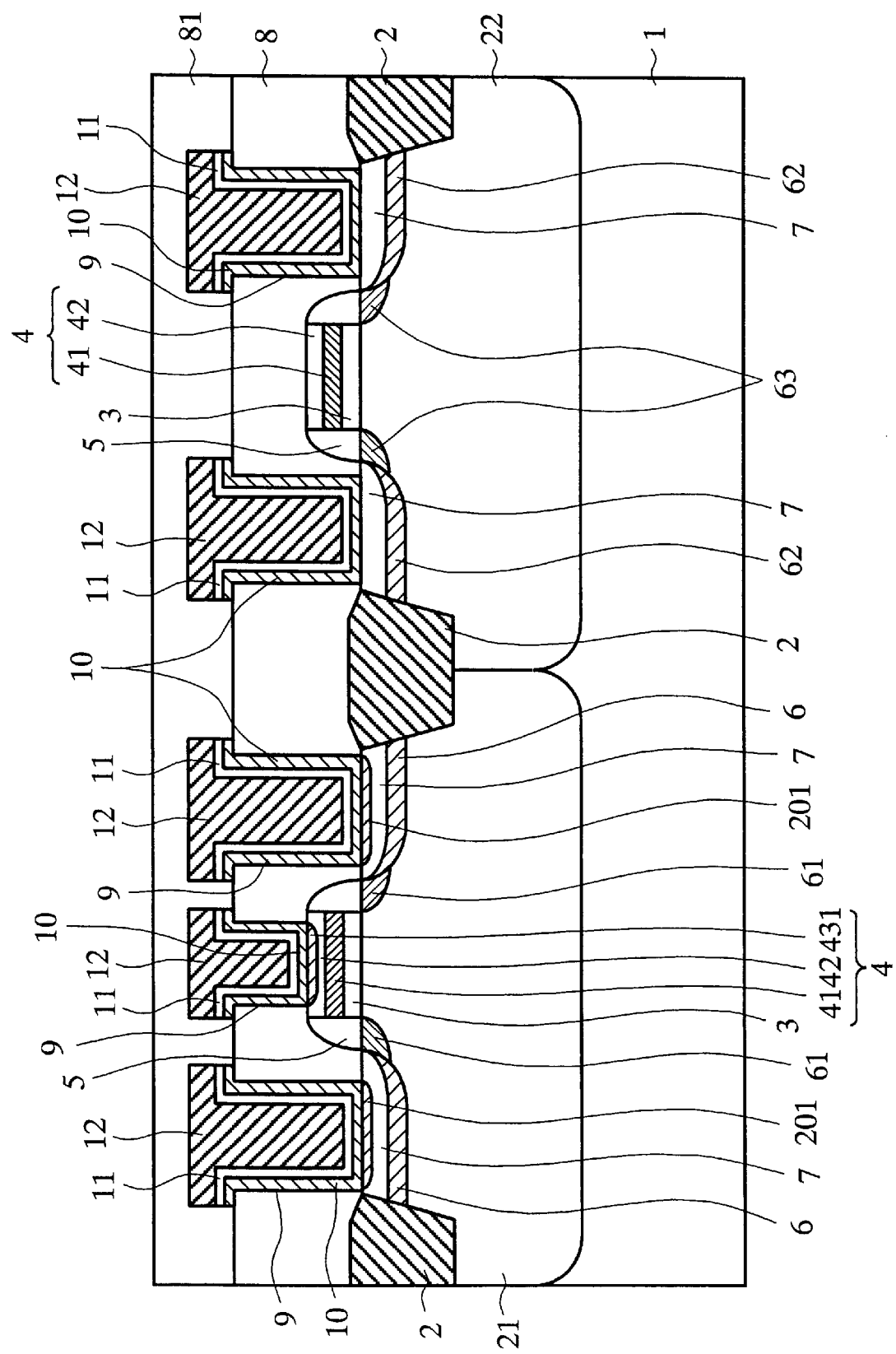
FIG. 10 is a cross-sectional view showing a structure of an embodiment 3 of the semiconductor device in accordance with the present invention.
Figure 11:
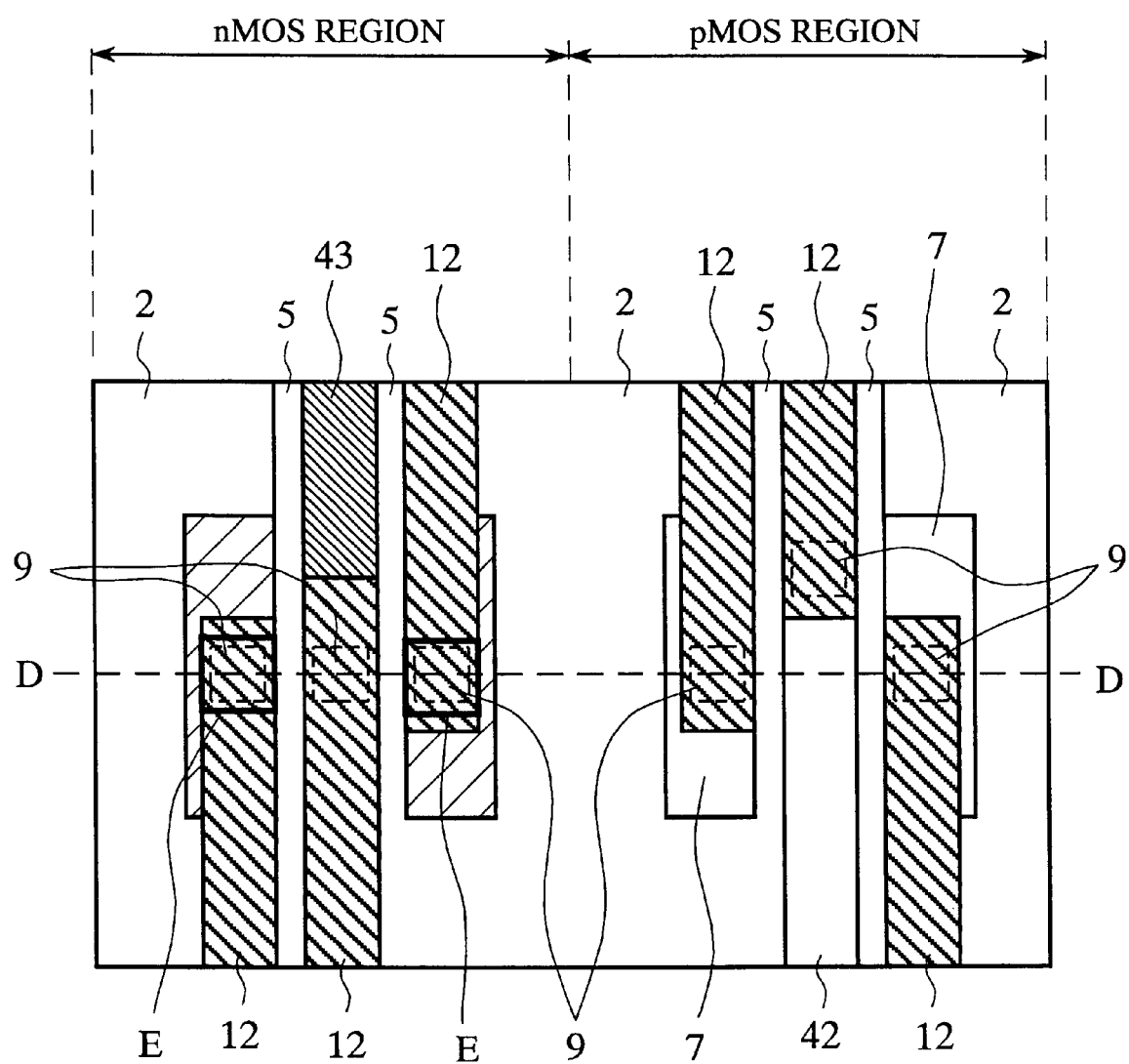
FIG. 11 is a plan view showing the structure of the embodiment 3 of the semiconductor device in accordance with the present invention.

FIG. 10 is a cross-sectional view showing a structure of elements of an embodiment 3 of the semiconductor device. In this figure, reference numerals 201 and 431 each designate a p-type impurity region. FIG. 11 is a plan view showing the elements of the embodiment 3 of the semiconductor device. The cross-sectional view of FIG. 10 is taken along the line D—D of FIG. 11. Referring to FIGS. 10 and 11, the p-type impurity regions 201 are formed only under the contact holes 9 connected to the source-drain regions 6 (portions enclosed by bold lines E in FIG. 11).

According to the present embodiment 3 of the semiconductor device, since the impurity regions with the conductivity type opposite to that of the n-type source-drain region are formed at the interfaces between the contact layers and the metal silicide films, the contact resistance at the interfaces between the contact layers and the metal silicide films can be reduce as in the pMOS region, thereby implementing a high-speed semiconductor device.

Furthermore, the depth from the surface of the semiconductor substrate to the pn-junction of the p-type impurity region and the n-type source-drain region is equal to or less than half the depth to the bottom of the metal silicide film formed on the surface of the source-drain region. Therefore, it is possible for the p-type impurity region to reform the metal silicide films, and to prevent the degradation in the characteristic of the transistors due to the diffusion of the p-type impurities to the n-type source-drain region.

Furthermore, since the p-type impurity regions are formed only under the contact holes connected to the n-type source-drain region in the logic circuit area, the degradation in the transistor characteristic can be further reduced which results from the diffusion of the p-type impurities to the n-type source-drain regions.

Next, a manufacturing process of the embodiment 3 of the semiconductor device in accordance with the present invention will be described.

Figure 12:
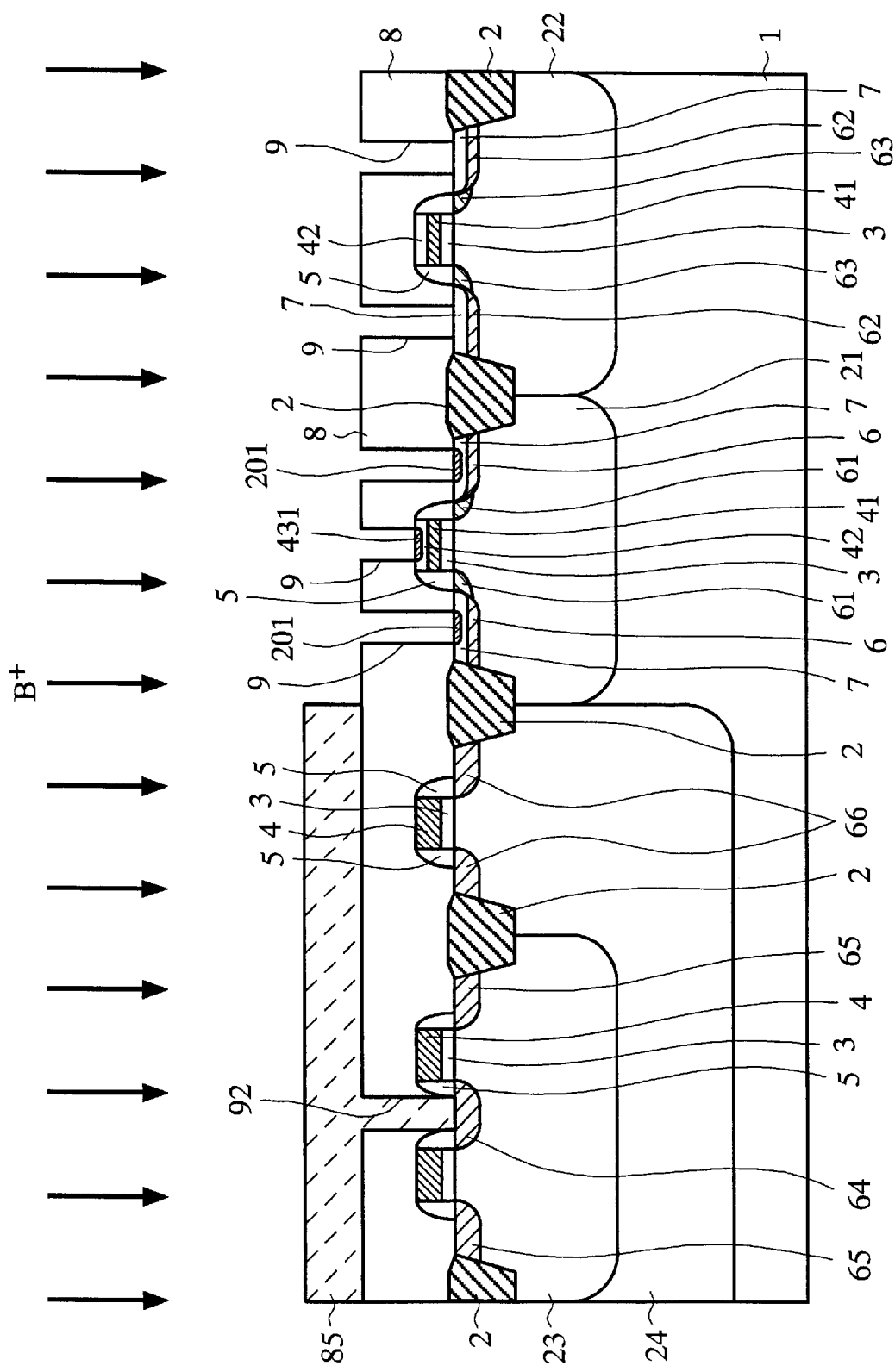
FIG. 12 is a cross-sectional view showing a step of a manufacturing process of the embodiment 3 of the semiconductor device in accordance with the present invention.

FIG. 12 is a cross-sectional view showing a step of the manufacturing process of the embodiment 3 of the semiconductor device, in which the reference numeral 85 designates a photoresist mask.

First, as in the embodiment 1, the isolation films 2, wells 21–24, gate insulators 3, polysilicon layers 41, source-drain regions 6 and 61–66, and sidewall insulators 5 are formed on the surface of the semiconductor substrate 1.

Then, as in the embodiment 1, the metal silicide films 7 and 42 are formed, followed by forming the interlayer insulating film 8 and the contact holes 9. After forming the photoresist mask 85 covering the surface of the contact hole 92 in the DRAM memory cell area, the p-type impurity regions 201 and 431 are formed by ion implanting the p-type impurities such as boron into the entire surface at 5 KeV and $1\times10^{15}/cm^2$. In this case, although the p-type impurities are injected into the surface of the source-drain region 62 of the pMOS region, this presents no problem because of the same p-type. It is unnecessary to form the photoresist mask 85, when the contact hole 92 reaching the source-drain region 64 of the DRAM memory cell area is not formed, and when the metal interconnections are formed after forming another interlayer insulating film.

Then, as in the embodiment 1, the contact layers 10, barrier metals 11, metal interconnections 12 and 121, interlayer insulating film 81 and capacitors 16 are formed, thereby completing the semiconductor device as shown in FIG. 10.

According to the manufacturing process of the present embodiment 3 of the semiconductor device, the p-type impurity regions, which have the conductivity type opposite to that of the n-type source-drain region, and are formed at the interfaces between the contact layers and the metal silicide films, can reduce the contact resistance at the interfaces between the contact layers and the metal silicide films, thereby implementing a high-speed semiconductor device.

In particular, as for a system LSI in which the transistors of the DRAM memory cells and logic circuits are formed on the same substrate, even when it undergoes the heat treatment for forming the capacitors of the DRAM memory cells after the metal interconnections for connecting the transistors of the logic circuits are formed, and hence the source-drain impurities of the nMOS transistors in the logic circuit area segregate to the interfaces between the contact layers and the metal silicide films, since the p-type impurity regions reform the metal silicide films, the manufacturing process of the semiconductor device can be implemented that can suppress the increase in the interface resistance between the contact layers and the metal silicide films.

Furthermore, since the p-type impurity regions are formed only under the contact holes connected to the n-type source-drain region in the logic circuit area, the degradation in the transistor characteristics can be further reduced which results from the diffusion of the p-type impurities to the n-type source-drain regions.

Besides, it is possible as in the embodiment 2 to improve the process performance by forming the p-type impurity regions 201 and 431 after forming the contact layers 10 and barrier metal layers 11 and before burying the metal to become the metal interconnections 12, because sufficient acceleration energy is maintained of the ion implantation for-forming the p-type impurity regions by carrying out the ion implantation through the contact layers 10 and barrier metal layers 11.

Embodiment 4

Figure 13:
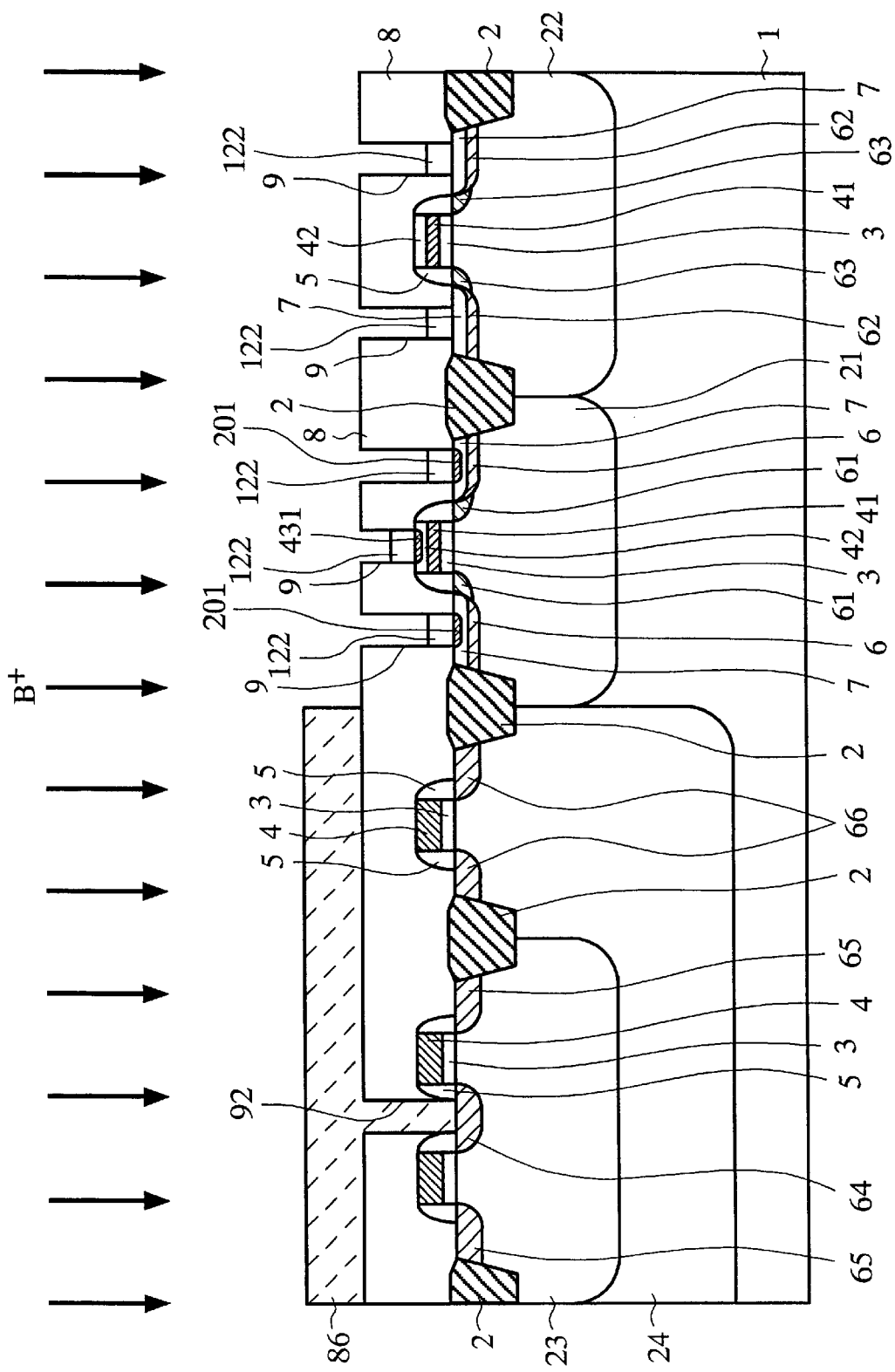
FIG. 13 is a cross-sectional view showing a step of a manufacturing process of an embodiment 4 of the semiconductor device in accordance with the present invention.
Figure 14:
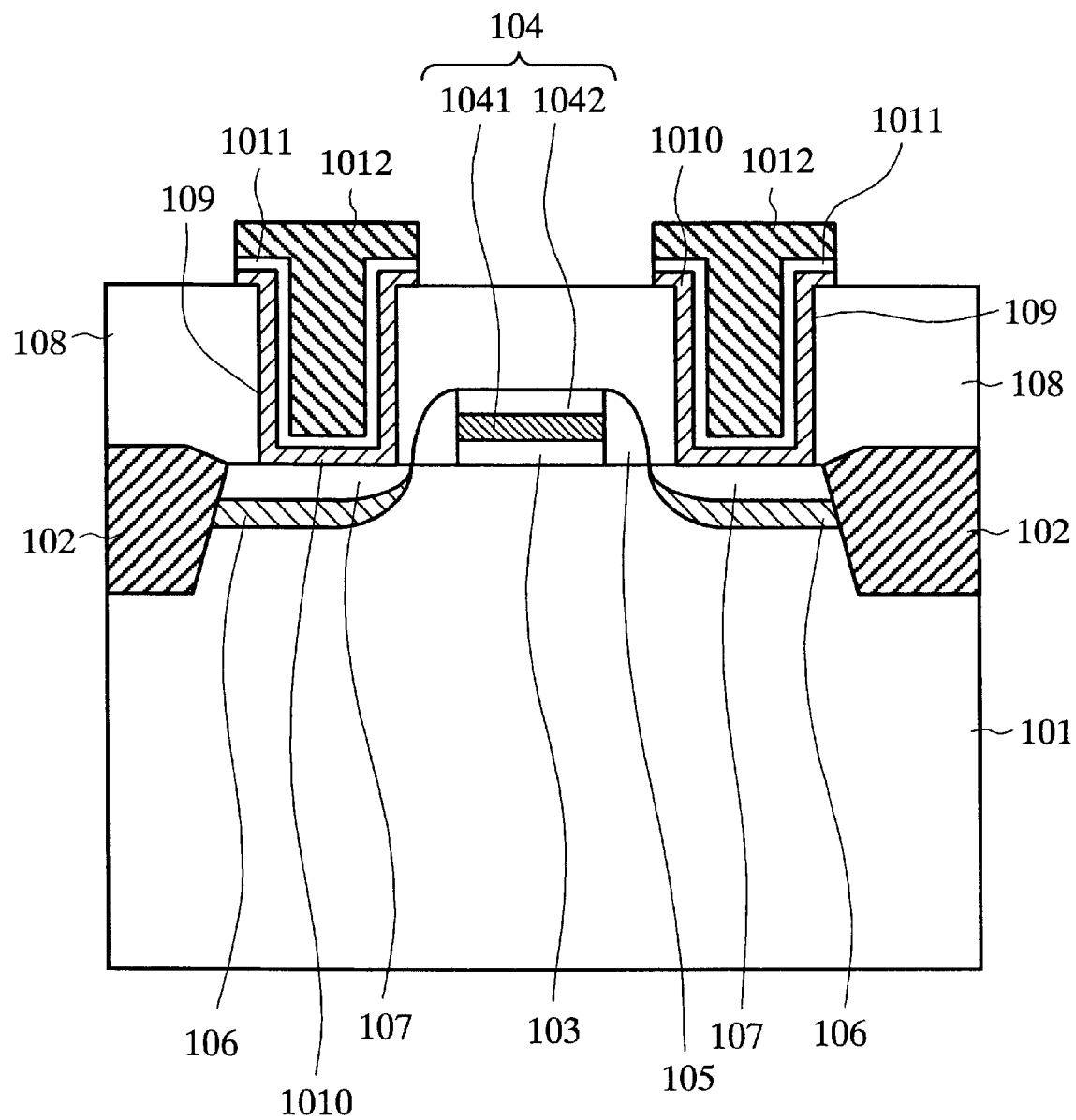
FIG. 14 is a cross-sectional view showing a structure of an element of a conventional semiconductor device.
Figure 15:
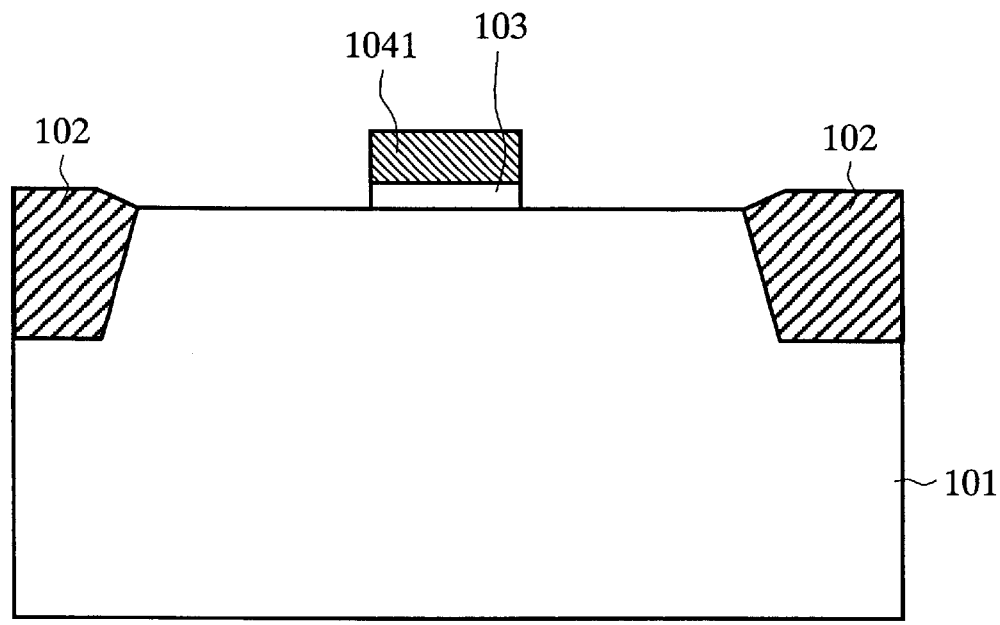
FIG. 15 is a cross-sectional view showing a step of a manufacturing process of the conventional semiconductor device.
Figure 16:
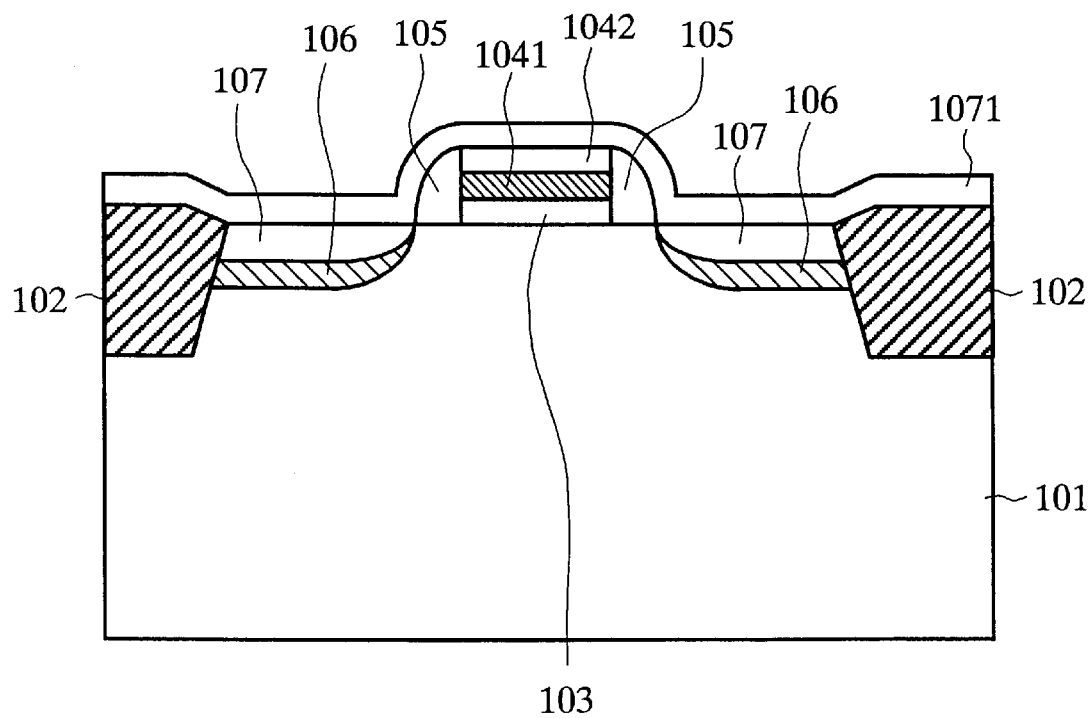
FIG. 16 is a cross-sectional view showing a step of the manufacturing process of the conventional semiconductor device.

FIG. 13 is a cross-sectional view showing a manufacturing process of an embodiment 4 of the semiconductor device, another manufacturing method of the semiconductor device of the foregoing embodiment 3. In FIG. 13, each reference numeral 122 designates a plug, and the reference numeral 86 designates a photoresist mask.

First, as in the embodiment 3, the isolation films 2, wells 21–24, gate insulators 3, polysilicon layers 41, source-drain regions 6 and 61–66, and sidewall insulators 5 are formed on the surface of the semiconductor substrate 1.

Then, as in the embodiment 3, the metal silicide films 7 and 42 are formed, followed by forming the interlayer insulating film 8 and contact holes 9. Subsequently, after applying an organic resin such as a photoresist onto the entire surface, for example, the plugs 122 of about 100 nm thick are formed in the contact holes 9 by etching back by an oxygen plasma process. Subsequently, after forming the photoresist mask 86 covering the surface of the contact hole 92 in the DRAM memory cell area, the p-type impurity regions 201 and 431 are formed by ion implanting the p-type impurities such as boron into the entire surface at 15 KeV and $1 \times 10^{15}/cm^2$. FIG. 13 is a cross-sectional view showing the elements of the semiconductor device at the end of these steps.

In this case, although the p-type impurities are implanted into the surface of the source-drain region 62 of the pMOS region, this presents no problem because of the same p-type.

It is unnecessary to form the photoresist mask 86 when the contact hole 92 reaching the source-drain region 64 of the DRAM memory cell area is not formed, and when the metal interconnections are formed after forming another interlayer insulating film.

Subsequently, after removing the plugs 122 and photoresist mask 86 in the contact holes 9 by the oxygen plasma process, the contact layers 10, barrier metals 11, metal interconnections 12 and 121, interlayer insulating film 81 and capacitors 16 are formed as in the embodiment 3, thereby constructing the semiconductor device as shown in FIG. 10.

According to the manufacturing process of the present embodiment 4 of the semiconductor device, the p-type impurity regions, which have the conductivity type opposite to that of the n-type source-drain region, and are formed at the interfaces between the contact layers and the metal silicide films, can reduce the contact resistance at the interfaces between the contact layers and the metal silicide films, thereby implementing a high-speed semiconductor device.

In particular, as for a system LSI in which the transistors of the DRAM memory cells and logic circuits are formed on the same substrate, even when it undergoes the heat treatment for forming the capacitors of the DRAM memory cells after the metal interconnections for connecting the transistors of the logic circuits are formed, and hence the source-drain impurities of the nMOS transistors in the logic circuit area segregate to the interfaces between the contact layers and the metal silicide films, since the p-type impurity regions reform the metal silicide films, the manufacturing process of the semiconductor device can be implemented that can suppress the increase in the interface resistance between the contact layers and the metal silicide films.

Furthermore, forming the p-type impurity regions by the ion implantation through the plugs in the contact holes makes it possible to maintain sufficient acceleration energy, thereby improving the processing performance.

In summary, the present invention has the following effects.

(1) Since the present invention comprises on the source-drain region the metal silicide films and the impurity regions with the conductivity type opposite to that of the source-drain region, it can reduce the contact resistance at the interfaces between the interconnections and the metal silicide films, thereby providing a high-speed semiconductor device.

(2) Furthermore, the depth of each impurity region with the conductivity type opposite to that of the source-drain region from the surface of the semiconductor substrate is made equal to or less than half the depth to the bottom of the metal silicide film formed on surface of the source-drain region. Thus, the impurity regions can reform the metal silicide films, and prevent the impurities in the impurity regions from diffusing to the source-drain regions, thereby preventing the degradation in the characteristic of the transistor due to the diffusion.

(3) In addition, since the impurity regions with the conductivity type opposite to that of the source-drain region are formed only at the neighborhood of the contact holes connected to the source-drain region, the degradation in the transistor characteristics can be further reduced which is due to the diffusion of these impurities to the source-drain region.

(4) The stack structure of the interconnections composed of the contact layer, the barrier metal and the metal can prevent an increase in the resistance at the interfaces between the interconnections and the source-drain region due to a decrease in the diameter of the contact holes, implementing a high-speed semiconductor device.

(5) As for a system LSI in which the capacitors of the DRAM memory cells are formed after the metal interconnections connected to the transistors of the logic circuits are formed, the diffusion of the impurities from the source-drain region in the logic circuit area can be suppressed even during the heat treatment for forming the capacitors. This can prevent an increase in the interface resistance between the contact layers and the metal silicide films, offering an advantage of being able to implement a high-speed semiconductor device.

(6) The impurity regions with the conductivity type opposite to that of the source-drain region, which are formed at the interfaces between the interconnections and the metal silicide films, can reduce the contact resistance at the interfaces between the interconnections and the metal silicide films, thereby providing a high-speed semiconductor device.

(7) Furthermore, the depth of impurity regions with the conductivity type opposite to that of the source-drain region from the surface of the semiconductor substrate are made equal to or less than half the depth to the bottom of the metal silicide films, the impurity can prevent, with reforming the metal silicide films, the impurities in the impurity regions from diffusing into the source-drain region, thereby preventing the degradation in the characteristic of the transistor due to the diffusion.

(8) Besides, the present invention can carry out the ion implantation to form the impurity regions with the conductivity type opposite to that of the source-drain region through the thin insulating film composed of silicon nitride or the like, which makes it possible to maintain sufficient acceleration energy, thereby improving the performance of the manufacturing process.

(9) In addition, the present invention can perform the ion implantation after forming the contact holes in the interlayer insulating film, which makes it possible to form the impurity regions with the conductivity type opposite to that of the source-drain region only at the neighborhood of the contact holes connected to the source-drain region. This can further prevent the degradation in the transistor characteristics due to the diffusion of these impurities to the source-drain region.

(10) Furthermore, since the present invention can form the impurity regions with the conductivity type opposite to that of the source-drain region by the ion implantation through the plugs in the contact holes, it can maintain sufficient acceleration energy, thereby improving the performance of the manufacturing process.

(11) In particular, as for a system LSI in which transistors of the DRAM memory cells and logic circuits are formed on the same substrate, even when it undergoes the heat treatment for forming the capacitors of the DRAM memory cells after the metal interconnections for connecting the transistors of the logic circuits are formed, and hence the source-drain impurities in the logic circuit area segregate to the interfaces between the contact layers and the metal silicide films, since the impurity regions with the conductivity type opposite to that of the source-drain region reform the metal silicide films, the manufacturing process of the semiconductor device can be implemented that can suppress the increase in the interface resistance between the contact layers and the metal silicide films.

What is claimed is:

1. A semiconductor device comprising:

an active region disposed on a main surface of a semiconductor substrate being surrounded by an isolation film;

first source region and drain region of a first conductivity type formed on the surface of said active region at a predetermined distance;

a first gate electrode formed on the main surface of said first active region via a gate insulator so as to face a region between said first source and drain region;

a first metal silicide film formed on the surface of said first source and drain region;

a first interconnection connected to said first source and drain region, respectively;

a first contact region formed around said first interconnection while keeping a predetermined distance from said first interconnection; and a first impurity region of a second conductivity type opposite to that of said first source and drain region, formed at interfaces between said first metal silicide film and said first contact region.

2. The semiconductor device according to claim 1, wherein the depth from the surface of said semiconductor substrate to a pn-junction of said first impurity region and said first source and drain region is equal to or less than half the depth to the bottom of said first metal silicide film.

3. The semiconductor device according to claim 1, wherein a plurality of said first impurity regions are formed.

4. The semiconductor device according to claim 1, wherein impurities contained in said first impurity regions are boron and boron fluoride.

5. The semiconductor device according to claim 1, further comprising:

a second source and drain region of a first conductivity type formed adjacent to said first source and drain region;

a second gate electrode formed on the surface of said active region via a gate insulator so as to face a region between said second source and drain region;

a second metal suicide film formed on the surface of said second source and drain region;

a second interconnection connected to said second source and drain region, respectively;

a second contact region formed around said second interconnection while keeping a predetermined distance from said second interconnection; and a second impurity region of a second conductivity type opposed to that of said second source and drain region, formed at interfaces between said second metal silicide film and said second contact region.

6. The semiconductor device according to claim 5, further comprising a capacitor connected to one of said second source and drain region.

* * * * *